(12) United States Patent
Jiang et al.

(10) Patent No.: US 11,125,394 B2
(45) Date of Patent: Sep. 21, 2021

(54) LED LAMP WITH LAMP SHELL AND PASSIVE HEAT DISSIPATING ELEMENT

(71) Applicant: JIAXING SUPER LIGHTING ELECTRIC APPLIANCE CO., LTD, Jiaxing (CN)

(72) Inventors: Tao Jiang, Jiaxing (CN); Mingbin Wang, Jiaxing (CN)

(73) Assignee: JIAXING SUPER LIGHTING ELECTRIC APPLIANCE CO., LTD, Jiaxing (CN)

( * ) Notice: Subject to any disclaimer, the term of this patent is extended or adjusted under 35 U.S.C. 154(b) by 0 days.

(21) Appl. No.: 17/035,601

(22) Filed: Sep. 28, 2020

(65) Prior Publication Data
US 2021/0025579 A1 Jan. 28, 2021

Related U.S. Application Data

(63) Continuation of application No. 16/724,420, filed on Dec. 23, 2019, now Pat. No. 10,830,426, which is a
(Continued)

(30) Foreign Application Priority Data

Feb. 8, 2018 (CN) .......................... 201810130085.3
May 18, 2018 (CN) .......................... 201810479044.5
(Continued)

(51) Int. Cl.
*F21K 9/23* (2016.01)
*F21K 9/233* (2016.01)
(Continued)

(52) U.S. Cl.
CPC .............. *F21K 9/233* (2016.08); *F21K 9/235* (2016.08); *F21K 9/237* (2016.08); *F21K 9/238* (2016.08);
(Continued)

(58) Field of Classification Search
CPC ...... F21V 29/503; F21V 29/773; F21V 29/83; F21V 7/0025; F21K 9/66; F21K 9/238;
(Continued)

(56) References Cited

U.S. PATENT DOCUMENTS 7,748,770 B2 7/2010 Heuel et al.
7,748,870 B2 7/2010 Chang et al.
(Continued)

FOREIGN PATENT DOCUMENTS

CN 201606689 U 10/2010
CN 201651880 U 11/2010
(Continued)

*Primary Examiner* — Anne M Hines
(74) *Attorney, Agent, or Firm* — Simon Kuang Lu

(57) ABSTRACT

An LED lamp includes: a lamp shell including a lamp head and a lamp neck, the lamp head connects to the lamp neck; a passive heat dissipating element having a heat sink connected to the lamp shell, wherein the heat sink comprises fins, a total height of the lamp neck and the lamp head is greater than a height of the heat sink; a power source disposed in the lamp shell; and a light emitting surface connected to the heat sink of the passive heat dissipating element and comprising LED chips electrically connected to the power source. The light emitting surface and the heat sink are connected to form a heat transferring path from the LED chips to the passive heat dissipating element; wherein a lateral outline of the LED lamp detours around an axis of the LED lamp 360 degrees turning around to form a contour of the LED lamp, the outline includes an outline of the lamp neck and an outline of the heat sink, the outline of the lamp neck has a slope A which is a constant, the outline of the heat sink has a slope B which is a constant, and an absolute value of the slope A is greater than that of the slope B.

21 Claims, 17 Drawing Sheets

Related U.S. Application Data continuation of application No. 16/267,747, filed on Feb. 5, 2019, now Pat. No. 10,677,438.

(30) Foreign Application Priority Data

| | | |
|---|---|---|
| May 28, 2018 | (CN) | 201810523952.X |
| Jun. 6, 2018 | (CN) | 201810573322.3 |
| Jun. 20, 2018 | (CN) | 201810634571.9 |
| Jul. 12, 2018 | (CN) | 201810763089.5 |
| Jul. 12, 2018 | (CN) | 201810763800.7 |
| Aug. 24, 2018 | (CN) | 201810972904.9 |
| Oct. 9, 2018 | (CN) | 201811172470.0 |
| Nov. 1, 2018 | (CN) | 201811295618.X |
| Nov. 2, 2018 | (CN) | 201811299410.5 |
| Nov. 13, 2018 | (CN) | CN201811347198.5 |
| Nov. 19, 2018 | (CN) | CN201811378174.6 |
| Dec. 3, 2018 | (CN) | CN201811466198.7 |

(51) Int. Cl.

| | |
|---|---|
| F21V 29/503 | (2015.01) |
| F21K 9/235 | (2016.01) |
| F21V 29/77 | (2015.01) |
| F21K 9/238 | (2016.01) |
| F21K 9/237 | (2016.01) |
| F21V 29/83 | (2015.01) |
| F21K 9/66 | (2016.01) |
| F21K 9/68 | (2016.01) |
| H05B 45/395 | (2020.01) |
| H05B 45/00 | (2020.01) |
| H05B 45/37 | (2020.01) |
| H05B 45/56 | (2020.01) |
| F21V 7/00 | (2006.01) |
| H03H 11/04 | (2006.01) |
| F21Y 115/10 | (2016.01) |
| F21Y 105/18 | (2016.01) |
| H03H 7/01 | (2006.01) |

(52) U.S. Cl.

CPC ............... *F21K 9/66* (2016.08); *F21K 9/68* (2016.08); *F21V 7/0025* (2013.01); *F21V 29/503* (2015.01); *F21V 29/773* (2015.01); *F21V 29/83* (2015.01); *H05B 45/00* (2020.01); *H05B 45/37* (2020.01); *H05B 45/395* (2020.01); *H05B 45/56* (2020.01); *F21Y 2105/18* (2016.08); *F21Y 2115/10* (2016.08); *H03H 7/0115* (2013.01); *H03H 11/04* (2013.01)

(58) Field of Classification Search

CPC . F21K 9/68; F21K 9/235; F21K 9/237; H05B 43/395; H05B 43/50

See application file for complete search history.

(56) References Cited

U.S. PATENT DOCUMENTS

| | | | |
|---|---|---|---|
| 8,985,815 B2 | 3/2015 | Chen et al. | |
| 9,341,362 B2 * | 5/2016 | Holmes | F21V 31/00 |
| 10,495,293 B1 | 12/2019 | Jiang et al. | |
| 10,508,802 B1 | 12/2019 | Jiang et al. | |
| 10,557,625 B2 | 2/2020 | Jiang et al. | |
| 10,648,657 B2 | 5/2020 | Jiang et al. | |
| 10,655,836 B2 | 5/2020 | Jiang et al. | |
| 10,677,438 B2 | 6/2020 | Jiang et al. | |
| 10,677,440 B2 | 6/2020 | Jiang et al. | |
| 10,677,441 B2 | 6/2020 | Jiang et al. | |
| 10,724,727 B2 | 7/2020 | Jiang et al. | |
| 10,731,838 B2 | 8/2020 | Jiang et al. | |
| 10,731,839 B2 | 8/2020 | Jiang et al. | |
| 10,731,840 B2 | 8/2020 | Jiang et al. | |
| 10,738,989 B2 | 8/2020 | Jiang et al. | |
| 10,767,846 B2 | 9/2020 | Jiang et al. | |
| 10,775,036 B2 | 9/2020 | Jiang et al. | |
| 10,782,011 B2 | 9/2020 | Jiang et al. | |
| 10,788,197 B2 | 9/2020 | Jiang et al. | |
| 10,788,198 B2 | 9/2020 | Jiang et al. | |
| 10,794,582 B2 | 10/2020 | Jiang et al. | |
| 10,801,711 B2 | 10/2020 | Jiang et al. | |
| 10,801,713 B2 | 10/2020 | Jiang et al. | |
| 10,816,185 B2 | 10/2020 | Jiang et al. | |
| 10,823,387 B2 | 11/2020 | Jiang et al. | |
| 10,830,427 B2 | 11/2020 | Jiang et al. | |
| 10,859,250 B2 | 12/2020 | Jiang et al. | |
| 10,859,251 B2 | 12/2020 | Jiang et al. | |
| 10,859,252 B2 | 12/2020 | Jiang et al. | |
| 10,865,969 B2 | 12/2020 | Jiang et al. | |
| 10,865,970 B2 | 12/2020 | Jiang et al. | |
| 10,876,724 B2 | 12/2020 | Jiang et al. | |
| 2003/0147254 A1 | 8/2003 | Yoneda et al. | |
| 2007/0230188 A1 | 10/2007 | Lin | |
| 2009/0067182 A1 | 3/2009 | Hsu et al. | |
| 2009/0141500 A1 | 6/2009 | Peng | |
| 2010/0124058 A1 * | 5/2010 | Miller | F21V 29/773 362/249.02 |
| 2010/0242519 A1 | 9/2010 | Breidenassel et al. | |
| 2011/0162823 A1 | 7/2011 | Sharma et al. | |
| 2011/0204790 A1 | 8/2011 | Arik et al. | |
| 2011/0234076 A1 | 9/2011 | Simon et al. | |
| 2012/0085516 A1 | 4/2012 | McClellan | |
| 2012/0230028 A1 | 9/2012 | Foo | |
| 2013/0163247 A1 * | 6/2013 | Lee | F21V 29/83 362/249.01 |
| 2014/0133153 A1 | 5/2014 | Boomgaarden et al. | |
| 2016/0025322 A1 | 1/2016 | Chen et al. | |
| 2017/0211771 A1 | 7/2017 | Nishimura et al. | |
| 2017/0276335 A1 | 9/2017 | Yun et al. | |
| 2018/0299114 A1 | 10/2018 | Inan et al. | |
| 2019/0285263 A1 | 9/2019 | Jiang et al. | |
| 2020/0124265 A1 | 4/2020 | Jiang et al. | |
| 2020/0149728 A1 | 5/2020 | Jiang | |
| 2020/0149733 A1 | 5/2020 | Jiang et al. | |
| 2020/0182449 A1 | 6/2020 | Jiang et al. | |
| 2020/0208827 A1 | 7/2020 | Jiang et al. | |
| 2020/0318825 A1 | 10/2020 | Jiang | |

FOREIGN PATENT DOCUMENTS

| | | |
|---|---|---|
| CN | 102032491 A | 4/2011 |
| CN | 102374427 A | 3/2012 |
| CN | 204114712 U | 1/2015 |
| CN | 104728631 A | 6/2015 |
| CN | 204785745 U | 11/2015 |
| CN | 205690117 U | 11/2016 |
| KR | 100932192 B1 | 12/2009 |

* cited by examiner

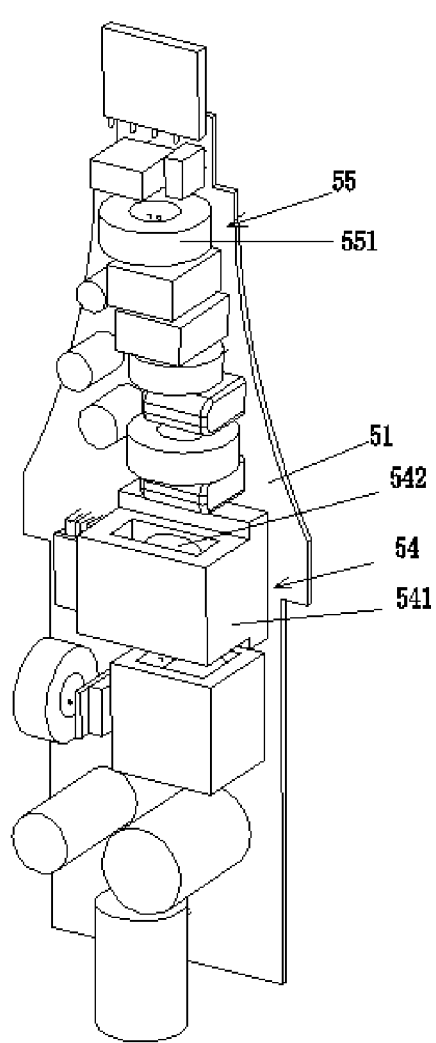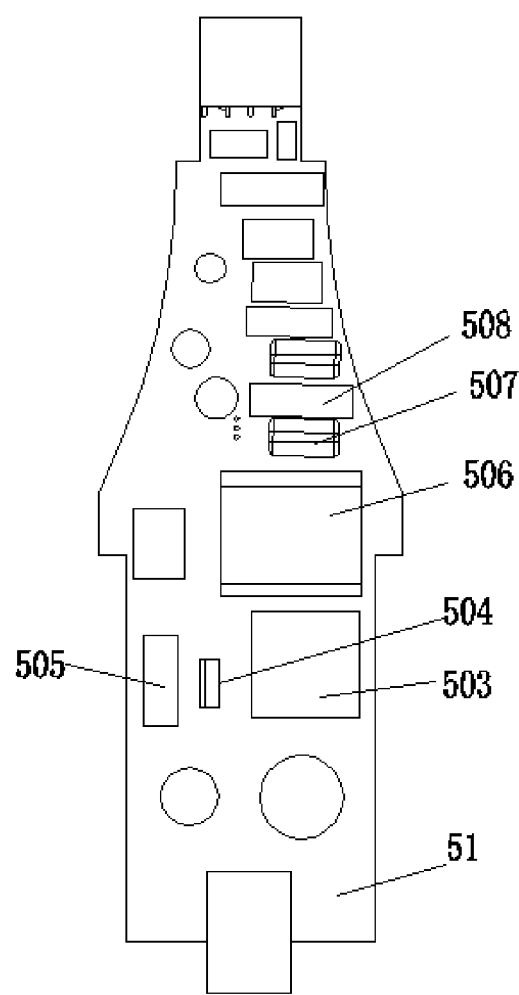
FIG. 19C     FIG. 19D
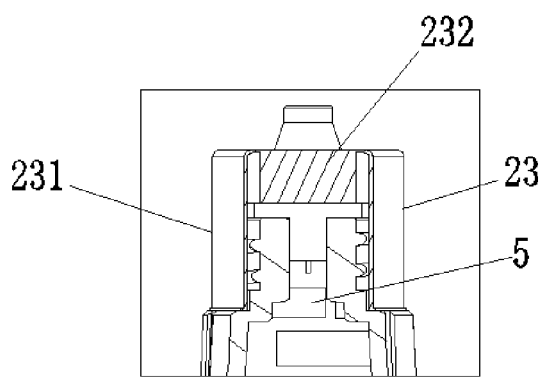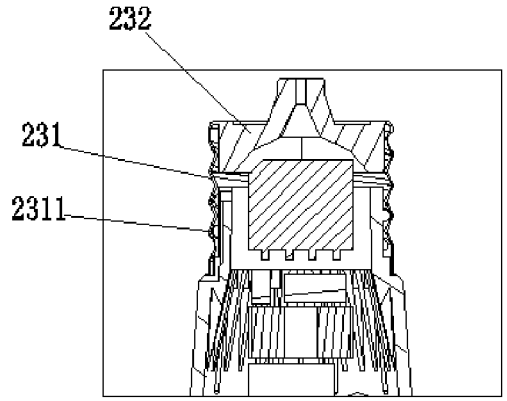
FIG. 20     FIG. 21

LED LAMP WITH LAMP SHELL AND PASSIVE HEAT DISSIPATING ELEMENT

CROSS-REFERENCE TO RELATED APPLICATIONS

This application is a continuation application of U.S. application Ser. No. 16/724,420 filed on 2019 Dec. 23, which is a continuation application of U.S. application Ser. No. 16/267,747 filed on 2019 Feb. 5, which claims priority to the following Chinese Patent Applications No. CN 201810130085.3 filed on 2018 Feb. 8, CN 201810479044.5 filed on 2018 May 18, CN 201810523952.X filed on 2018 May 28, CN 201810573322.3 filed on 2018 Jun. 6, CN 201810634571.9 filed on 2018 Jun. 20, CN 201810763800.7 field on 2018 Jul. 12, CN 201810763089.5 filed on 2018 Jul. 12, CN 201810972904.9 filed on 2018 Aug. 24, CN 201811172470.0 filed on 2018 Oct. 9, CN 201811295618.X filed on 2018 Nov. 1, CN 201811299410.5 filed on 2018 Nov. 2, CN 201811347198.5 filed on 2018 Nov. 13, CN 201811378174.6 filed on 2018 Nov. 19, and CN 201811466198.7 filed on 2018 Dec. 3, the disclosures of which are incorporated herein in their entirety by reference.

FIELD OF THE INVENTION

The invention relates to lighting, particularly to LED lamps with lamp shell and passive dissipating element.

BACKGROUND OF THE INVENTION

Because LED lamps possess advantages of energy saving, high efficiency, environmental protection and long life, they have been widely adopted in the lighting field. For LED lamps used as an energy-saving green light source, a problem of heat dissipation of high-power LED lamps becomes more and more important. Overheating will result in attenuation of lighting efficiency. If waste heat from working high-power LED lamps cannot be effectively dissipated, then the life of LED lamps will be directly negatively affected. As a result, in recent years, solution to the problem of heat dissipation of high-power LED lamps is an important issue for the industry.

OBJECT AND SUMMARY OF THE INVENTION

The LED lamp described in the present disclosure includes an LED (light emitting diode) lamp including a lamp shell including a lamp head and a lamp neck, the lamp head connects to the lamp neck; a passive heat dissipating element having a heat sink connected to the lamp shell, wherein the heat sink comprises fins, total height of the lamp neck and the lamp head is greater than height of the heat sink; a power source disposed in the lamp shell; and a light emitting surface connected to the heat sink of the passive heat dissipating element and comprising LED chips electrically connected to the power source, wherein the light emitting surface and the heat sink are connected to form a heat transferring path from the LED chips to the passive heat dissipating element; wherein a lateral outline of the LED lamp detours around an axis of the LED lamp 360 degrees turning around to form a contour of the LED lamp, the lateral outline includes an outline of the lamp neck and an outline of the heat sink, the outline of the lamp neck has a slope A which is a constant, the outline of the heat sink 1 has a slope B which is a constant, and an absolute value of the slope A is greater than that of the slope B; a line between the center of the top and the bottom point of the outline of the lamp neck is used to represent the outline of the lamp neck, a line between the center of the top and the bottom point of the outline of the heat sink is used to represent the outline of the heat sink.

In some embodiment, the absolute value of slope A is greater than 2.

In some embodiment, the absolute value of slope A is between 3 and 4.

In some embodiment, the absolute value of slope B is smaller than 3.

In some embodiment, the absolute value of slope B is between 1.4 and 2.

In some embodiment, any point on the outline of the lamp neck meets a formula as follows: $y=-ax+k1+h$, where k1 is a constant and h is height of the heat sink.

In some embodiment, any point on the outline of the heat sink meets a formula as follows: $y=-bx+k2$, where k2 is a constant.

In some embodiment, overall weight of the LED lamp is less than 1.7 Kg, when the LED lamp is provided with power of no more than 300 W, the LED chips are lit up and emit luminous flux of at least 25000 lumens.

In some embodiment, the light emitting surface includes at least one LED chip set having LED chips, at least one fin of the heat sink is projected onto a plane on which the LED chip set is located along an axial direction of the LED lamp, a projection of the at least one fin overlaps at least one LED chip of the LED chip set.

In some embodiment, any of the fins is projected onto a plane on which the LED chip set is located along the axial direction of the LED lamp, a projection of any of the fins overlaps at least one LED chip of the LED chip set.

In some embodiment, the lamp neck has an airflow limiting surface which extends radially outwardly and is located away from the lamp head, the airflow limiting surface cloaks at least part of the fins.

In some embodiment, the LED lamp comprises a heat dissipating channel, the heat sink further comprises a base, the heat dissipating channel formed in the fins and the base of the heat sink.

In some embodiment, the light emitting surface has an inner border and an outer border, both the inner border and the outer border separately extend upward along the axial direction of the LED lamp to form a region, an area of part of the fins inside the region is greater than an area of part of the fins outside the region.

The LED lamp described in embodiment of the present disclosure includes an LED (light emitting diode) lamp including An LED (light emitting diode) lamp comprising: a lamp shell including a lamp head and a lamp neck, the lamp head connects to the lamp neck; a passive heat dissipating element having a heat sink connected to the lamp shell, wherein the heat sink comprises fins, wherein a total height of the lamp neck and the lamp head is greater than a height of the heat sink; a power source disposed in the lamp shell; and a light emitting surface connected to the heat sink of the passive heat dissipating element and comprising LED chips electrically connected to the power source, wherein the light emitting surface and the heat sink are connected to form a heat transferring path from the LED chips to the passive heat dissipating element; the light emitting surface includes at least one LED chip set having LED chips, at least one fin of the heat sink is projected onto a plane on which the LED chip set is located along an axial direction of the LED lamp, a projection of the at least one fin at least overlaps at least one LED chip of the LED chip set; the lamp neck has an airflow limiting surface which extends radially outwardly and is located away from the lamp head, and the airflow limiting surface cloaks at least part of the fins.

In some embodiment, any of the fins is projected onto a plane on which the LED chip set is located along the axial direction of the LED lamp, a projection of any of the fins overlaps at least one LED chip of the LED chip set.

In some embodiment, at least one fin of the heat sink is divided into two portions in a radial direction of the LED lamp, a gap between the two portions forms a passage to allow air to pass.

In some embodiment, the gap directly exactly corresponds to an area that the LED chips are positioned on the light emitting surface.

In some embodiment, overall weight of the LED lamp is less than 1.7 Kg, when the LED lamp is provided with power of no more than 300 W, the LED chips are lit up and emit luminous flux of at least 25000 lumens.

In some embodiment, the LED lamp comprises a heat dissipating channel, the heat sink further comprises a base, the heat dissipating channel is formed in the fins and the base of the heat sink.

In some embodiment, the light emitting surface has an opening to form an air inlet for the heat dissipating channel, the opening is provided in the central area of the light emitting surface.

In some embodiment, the light emitting surface has an inner border and an outer border, both the inner border and the outer border separately extend upward along the axial direction of the LED lamp to form a region, wherein an area of part of the fins inside the region is greater than an area of part of the fins outside the region.

BRIEF DESCRIPTION OF THE DRAWINGS

The following detailed description, given by way of example, and not intended to limit the present invention solely thereto, will be best be understood in conjunction with the accompanying figures:

FIGS. 19A~19C are perspective views of the power source, according to some embodiments of the present invention;

FIG. 19D is a main view of the power source of the embodiments of FIGS. 19A~19C;

FIG. 20 is an enlarged view of portion B in FIG. 2;

FIG. 21 is a partially schematic view of an LED lamp;

DETAILED DESCRIPTION OF THE EMBODIMENTS

To make the present invention understandable and readable, the following disclosure will now be described in the following embodiments with reference to the drawings. The following descriptions of various embodiments of this invention are presented herein for purpose of illustration and giving examples only. It is not intended to be exhaustive or to be limited to the precise form disclosed. These example embodiments are just examples and many implementations and variations are possible without the details provided herein. Some terms mentioned in the following description, such as "in an axis", "above" or "under", are used for clear structural relationship of elements, but not a limit to the present invention. In the present invention, the terms "perpendicular", "horizontal" and "parallel" are defined in a range of ±10% based on a standard definition. For example, "perpendicular" (perpendicularity) means the relationship between two lines which meet at a right angle (90 degrees). However, in the present invention, "perpendicular" may encompass a range from 80 degrees to 100 degrees. In addition, "using condition" or "using status" mentioned in the present disclosure means a "head-up" hanging scenario. Exceptions will be particularly described.

Figure 1:
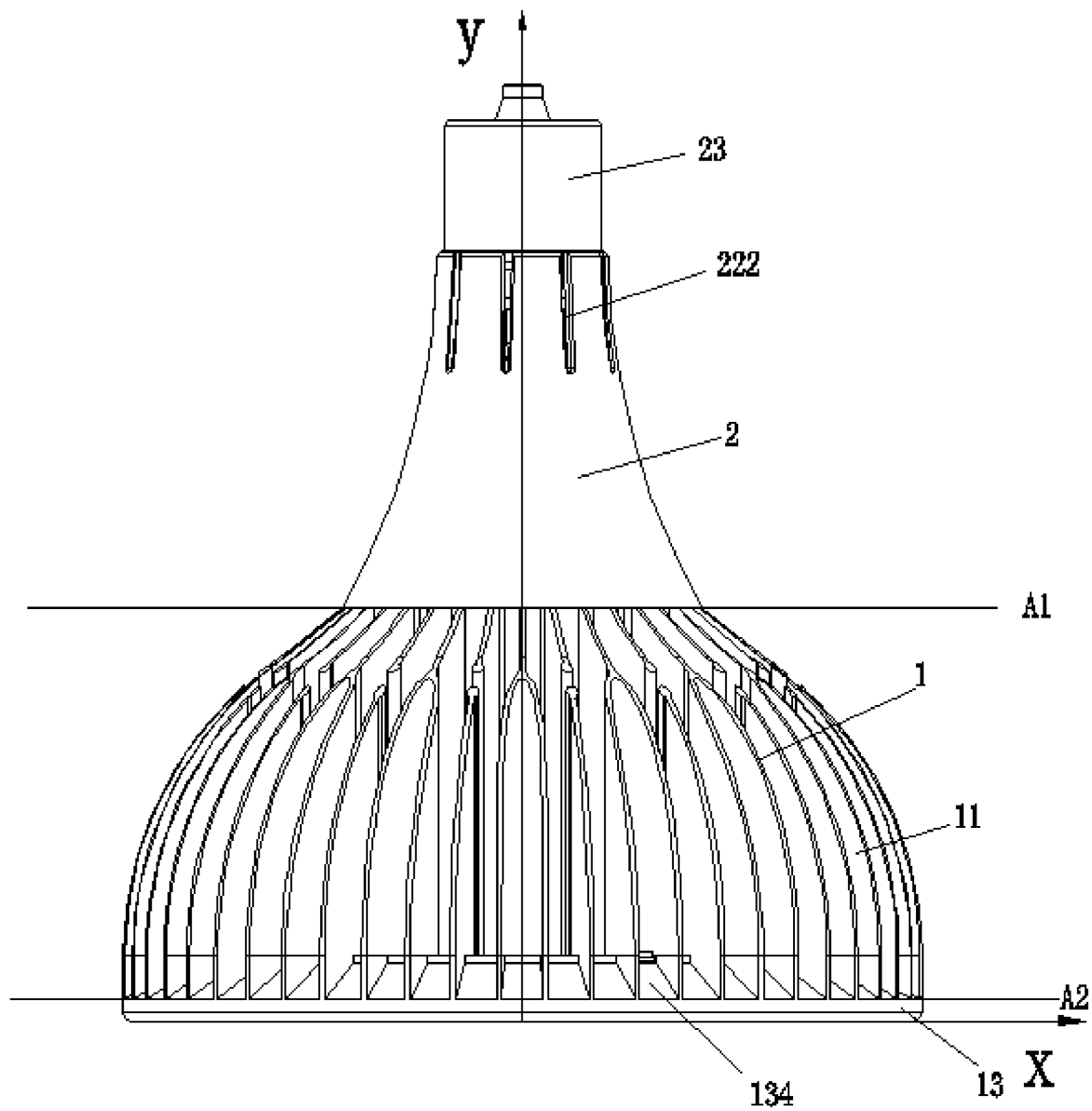
FIG. 1 is a structural schematic view of one embodiment of an LED lamp according to aspects of the invention.
Figure 2:
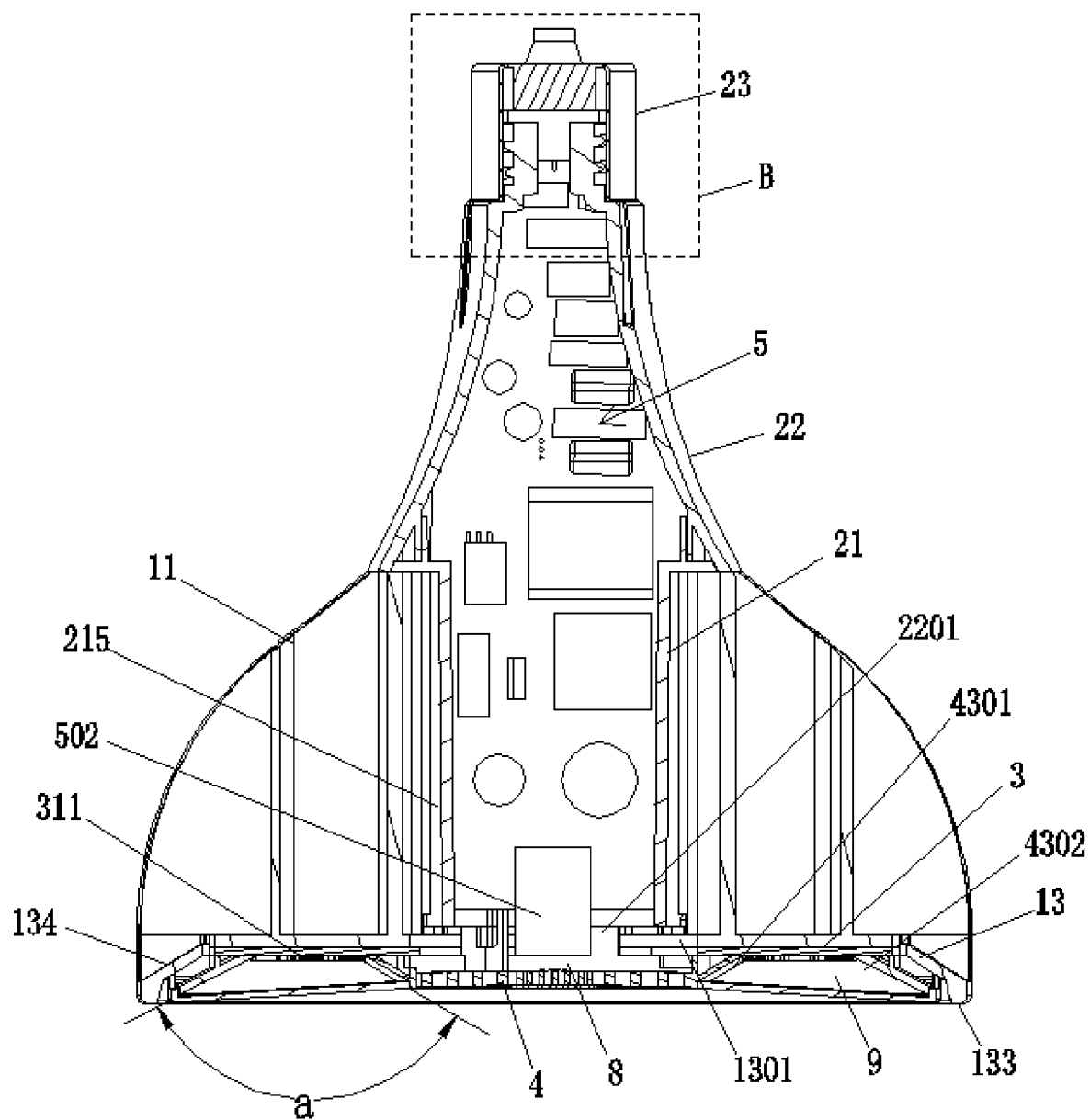
FIG. 2 is a schematic cross-sectional view of the LED lamp of FIG. 1.
Figure 3:
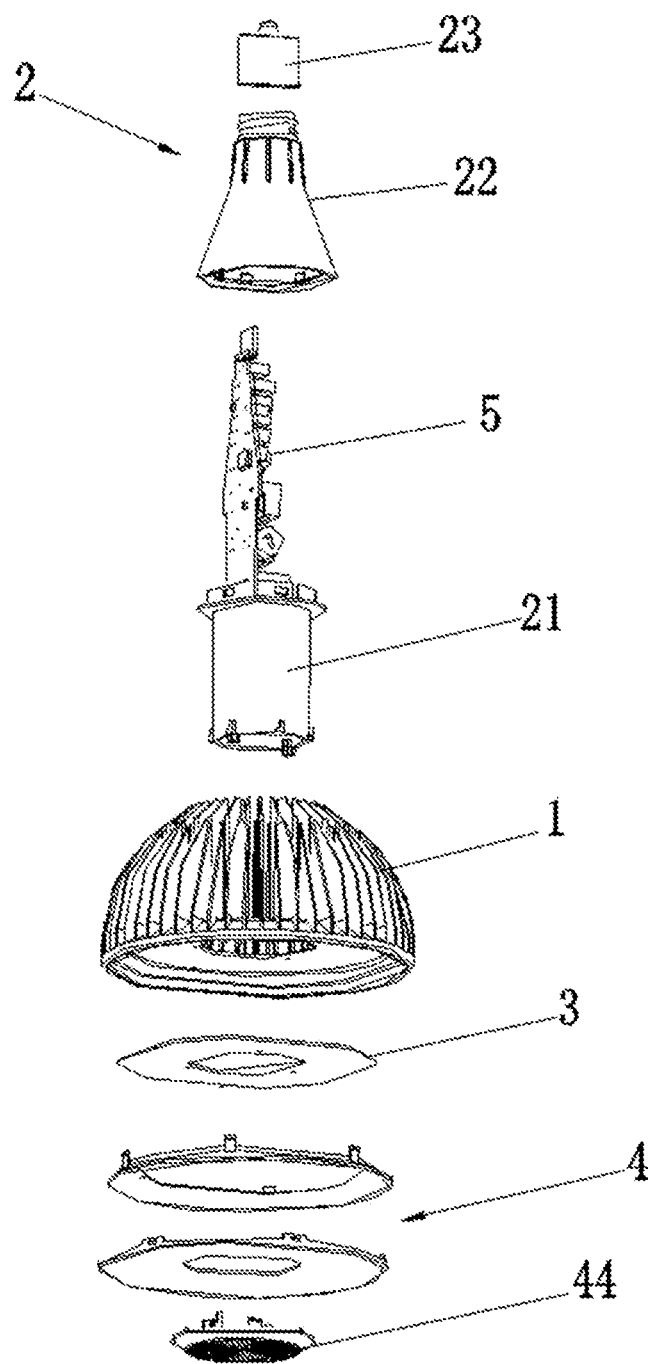
FIG. 3 is an exploded view of the LED lamp of FIG. 1.

FIG. 1 is a structural schematic view of an embodiment of an LED lamp according to certain aspects of the invention. FIG. 2 is a schematic cross-sectional view of the LED lamp of FIG. 1. FIG. 3 is an exploded view of the LED lamp of FIG. 1. As shown in the figures, the LED lamp includes a heat sink 1, a lamp shell 2, a light board 3, a lamp cover 4 and a power source 5. In this embodiment, the light board 3 is connected to the heat sink 1 by attachment for rapidly transferring heat from the light board 3 to the heat sink 1 when the LED lamp is working. In some embodiments, the light board 3 is riveted to the heat sink 1. In some embodiments, the light board 3 is screwed to the heat sink 1. In some embodiments, the light board 3 is welded to the heat sink 1. In some embodiments, the light board 3 is adhered to the heat sink 1. In this embodiment, the lamp shell 2 is connected to the heat sink 1, the lamp cover 4 covers the light board 3 to make light emitted from the light board 3 pass through the lamp cover to project out. The power source 5 is located in a chamber of the lamp shell 2 and the power source 5 is EC to the LED chips 311 for providing electricity.

Figure 4:
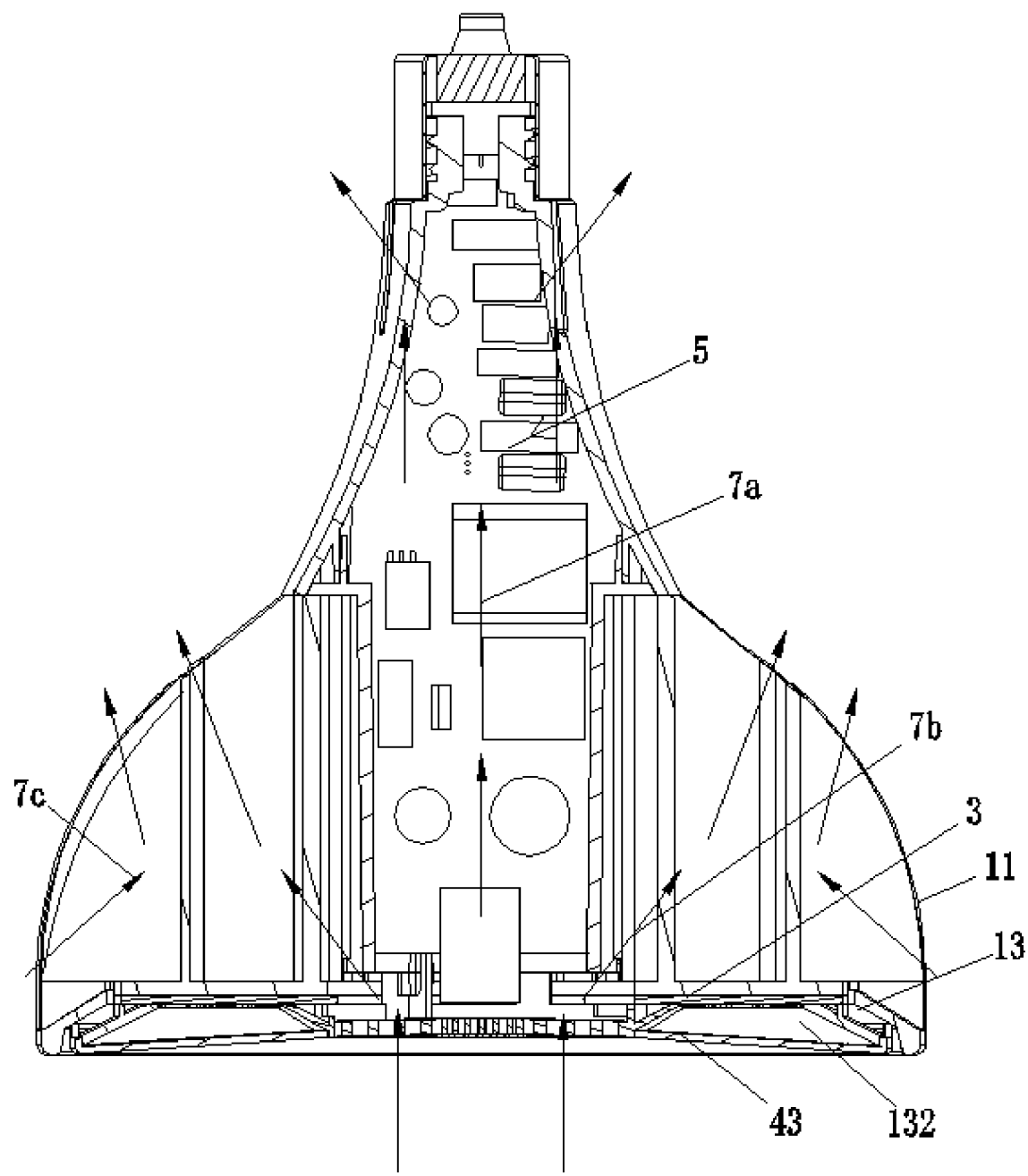
FIG. 4 is a schematic cross-sectional view of the LED lamp of FIG. 1, which shows the first heat dissipating channel and the second heat dissipating channel, and the third heat dissipating channel.

FIG. 4 is a schematic cross-sectional view of the LED lamp, according to one embodiment. As shown in FIGS. 2 and 4, the chamber of the lamp shell 2 of this embodiment is formed with a first heat dissipating channel 7a. An end of the first heat dissipating channel 7a is formed with a first air inlet 2201. An opposite end of the lamp shell 2 is formed with a venting hole 222 (at an upper portion of the lamp neck 22). Air flows into the first air inlet 2201 and flows out from the venting hole 222 for bringing out heat in the first heat dissipating channel 7a (primarily, heat from the working power source 5). As for the path of heat dissipation, heat generated from the heat-generating components of the working power source 5 is transferred to air (around the heat-generating components) in the first heat dissipating channel 7a by thermal radiation first, and then external air enters the first heat dissipating channel 7a by convection to bring out internal air to make heat dissipation. In some embodiment, the venting hole 222 at the lamp neck 22 can also provide direct heat dissipation.

As shown in FIGS. 1, 2 and 4, a second heat dissipating channel 7b is formed in the fins 11 and the base 13 of the heat sink 1, according to some embodiment. The second heat dissipating channel 7b has a second air inlet 1301. In this embodiment, the first air inlet 2201 and the second air inlet 1301 share the same opening formed on the light board 3. This will be described in more detail later. Air flows from outside of the LED lamp into the second air inlet 1301, passes through the second heat dissipating channel 7b and finally flows out from spaces between the fins 11 so as to bring heat out from the fins 11 to enhance heat dissipation of the fins 11. As for the path of heat dissipation, heat generated from the LED chips 311 is conducted to the heat sink 1, the fins 11 of the heat sink 1 radiate the heat to the surrounding air, and convection is performed in the second heat dissipating channel 7b to bring out heated air in the heat sink 1 to provide for heat dissipation.

As shown in FIGS. 1 and 4, the heat sink 1 is provided with a third heat dissipating channel 7c formed between two adjacent fins 11 or in a space between two sheets extending from a single fin 11, according to some embodiment of the present invention. A radial outer portion between two fins 11 forms an intake of the third heat dissipating channel 7c. Air flows into the third heat dissipating channel 7c through the radial outer portion of the LED lamp to bring out heat radiated from the heat sink 11 to the ambient air.

Figure 5:
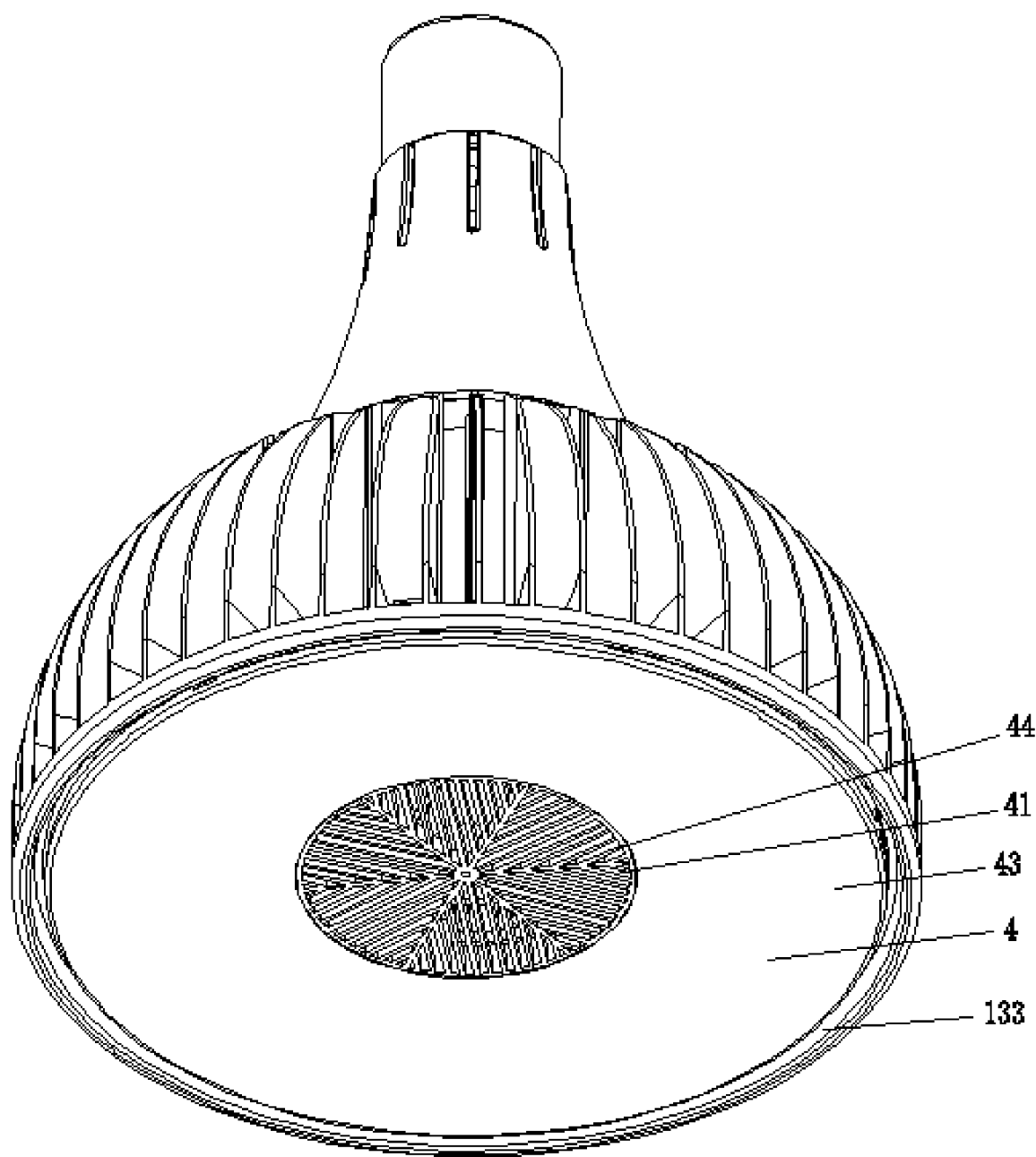
FIG. 5 is a perspective view of the LED lamp of FIG. 1, according to one embodiment.
Figure 6:
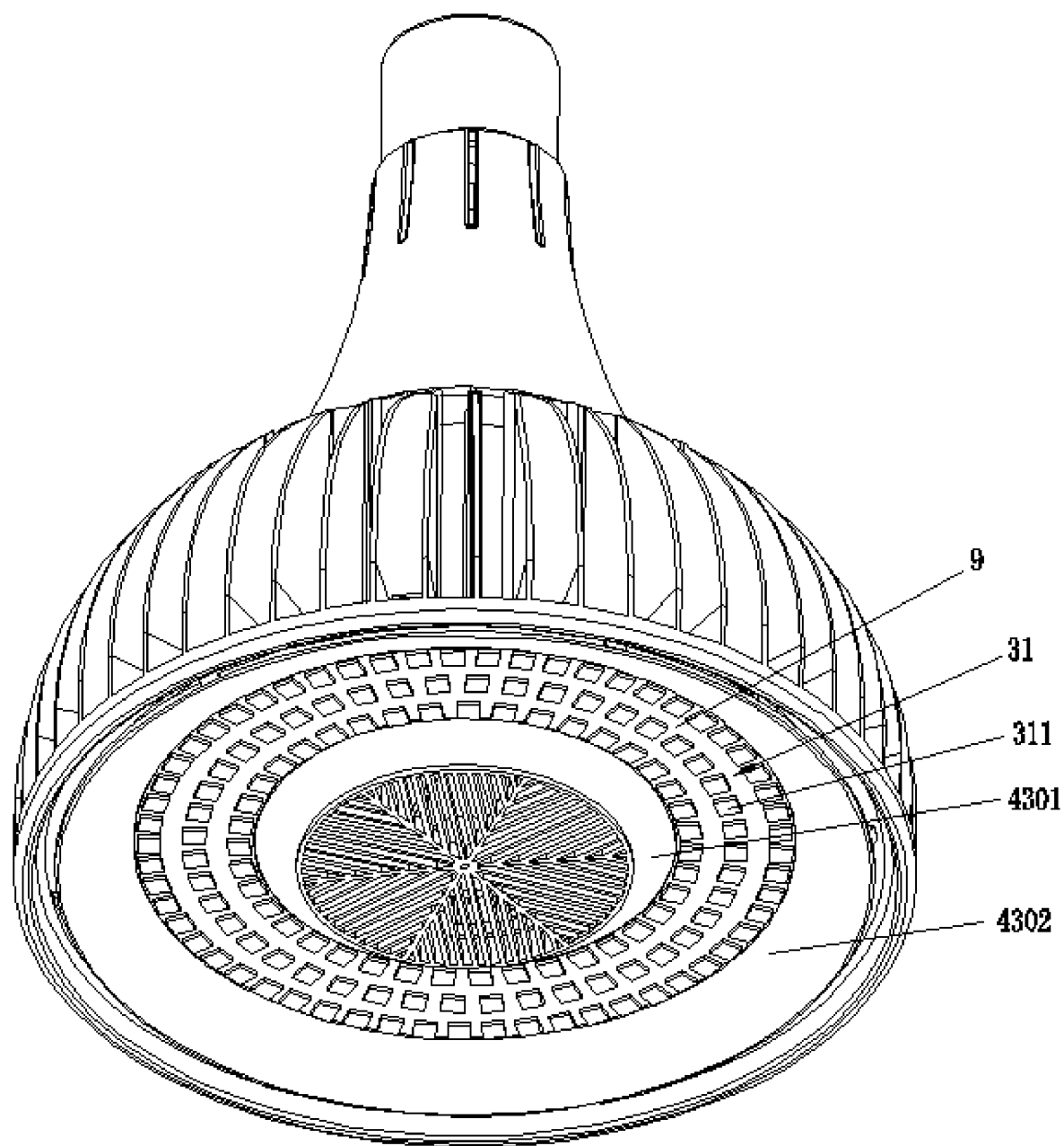
FIG. 6 is a structural schematic view of FIG. 5 without the light output surface.

FIG. 5 is a perspective view of the LED lamp of an embodiment, which shows assemblage of the heat sink 1 and the lamp cover 4, according to one embodiment of the present invention. FIG. 6 is a structural schematic view of FIG. 5 without the light output surface 43. As shown in FIGS. 5 and 6, in this embodiment, the lamp cover 4 includes a light output surface 43 and an end surface 44 with a vent 41. Air flows into both the first heat dissipating channel 7a and the second heat dissipating channel 7b through the vent 41. When the LED chips 311 (shown in FIG. 6) are illuminated, the light passes through the light output surface 43 to be projected from the lamp cover 4. In this embodiment, the light output surface 43 may include currently available light-permeable material such as glass, PC, etc. The term "LED chip" mentioned in all embodiments of the invention means all light sources with one or more LEDs (light emitting diodes) as a main part, and includes but is not limited to an LED bead, an LED strip or an LED filament. Thus, the LED chip mentioned herein may be equivalent to an LED bead, an LED strip or an LED filament.

Still referring to FIG. 5, the area of the light output surface 43 (area of a single side of the light output surface 43, i.e. area of surface of the side away from the LED chips 311) is more than three times as large as the area of light emitting surface of all the LED chips 311 but does not exceed ten times, according to some embodiment. In other embodiments, the area of the light output surface 43 varies according to the specific application and/or light efficiency of the LED lamp.

As shown in FIGS. 5 and 6, in this embodiment, an inner reflecting surface 4301 is disposed inside the light output surface 43 of the lamp cover 4. The inner reflecting surface 4301 is disposed in the inner circle of the array of LED chips 311. In an embodiment, an outer reflecting surface 4302 is disposed in the outer circle of the array of LED chips 311. The outer reflecting surface 4302 corresponds to the LED chips 311 on the light board 3. The arrangement of both the inner reflecting surface 4301 and the outer reflecting surface 4302 is used for adjusting a light emitting range of the LED chip set 31 to concentrate the light concentrated and/or to increase brightness in a local area. For example, under the condition of the same luminous flux, illuminance of the LED lamp can be increased. In one example, all the LED chips 311 in this embodiment are mounted on the bottom side of the light board 3. In this embodiment, the LED lamp of the present embodiment does not emit lateral light from the LED chips 311. When working, the primary light emitting surfaces of the LED chips 311 are completely downward. At least 60% of the light from the LED chips 311 are emitted through the light output surface 43 without reflection, according to some embodiment. As a result, in comparison with those LED lamps with lateral light (the lateral light is reflected by a cover or a lampshade to be emitted downward, and in theory there must be part of light loss in the process of reflection), the LED chips 311 in this embodiment possess better light emitting efficiency. In one example, under the condition of the same lumen value (luminous flux), the LED lamp in the present embodiment possesses higher illuminance. And the emitted light can be concentrated to increase illuminance in a local area by the arrangement of both the inner reflecting surface 4301 and the outer reflecting surface 4302, for example, in an area under the LED lamp between 120 degrees and 130 degrees (a light emitting range under the LED lamp between 120 degrees and 130 degrees).

As shown in FIG. 6, an inner edge of the inner reflecting surface 4301 abuts against the light board 3 to prevent light from passing through gaps between the inner reflecting surface 4301 and the light board 3 to avoid loss of part of light, according to one embodiment. Identically, an inner edge of the outer reflecting surface 4302 abuts against the light board 3 to prevent light from passing through gaps between the outer reflecting surface 4302 and the light board 3 to avoid loss of part of light.

The LED chips 311 may be manufactured or assembled in a sealed room to prevent dust from covering the LED Chips 311, thus reducing light efficiency or affecting heat dissipation. As shown in FIG. 6, in some embodiments, a sealed chamber 9 is formed between the light output surface 43, the inner reflecting surface 4301, the outer reflecting surface 4302 and the light board 3 (this term "sealed" mentioned here may mean "without obvious pores", not including unavoidable gaps in an assembling process). In some embodiments, when omitting both the inner and outer reflecting surfaces 4301, 4302, respectively, the sealed chamber 9 is formed between the light output surface 43 and the light board 3 or between the light output surface 43, the heat sink 1 and the light board 3.

Figure 8:
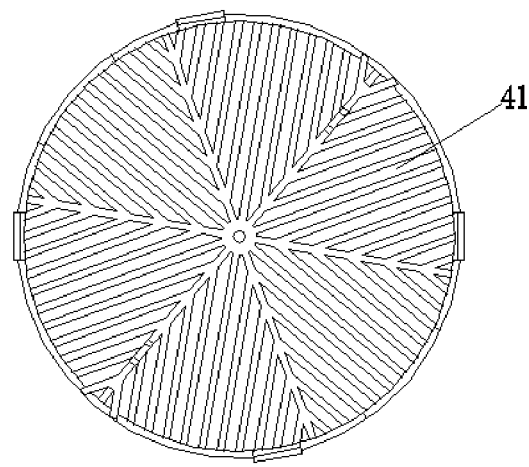
FIG. 8 is a schematic view of an end surface of the lamp cover according to one embodiment of the present invention.

FIG. 8 is a schematic view of an end surface 44 of the lamp cover 4 according to one embodiment. According to one embodiment, the ratio of a total of cross-sectional area of the vent 41 to overall area of the end surface 44 (area of a single side of the end surface 44, such as the side away from the LED chips 311) is 0.01~0.7. In some embodiment, the ratio of a total of cross-sectional area of the vent 41 to overall area of the end surface 44 is 0.3~0.6. In other embodiment, the ratio of a total of cross-sectional area of the vent 41 to overall area of the end surface 44 is 0.4~0.55. By limiting the ratio of a total of cross-sectional of the vent 41 to overall area of the end surface 44 to the above ranges, not only can air intake of the vent 41 be surely existed, but also adjustment of area of the vent 41 is implemented under ensuring structural strength of the end surface 44 (Excessive area of the vent 41 maybe affects the structural strength of the end face). When the ratio of area of the vent 41 to area of the end surface 44 is 0.4~0.55, not only can air intake of the vent 41 be better to satisfy requirements of heat dissipation of the LED lamp, but also the area size of the vent 41 does not affect structural strength of the end surface 44 to prevent the end surface 44 with the vent 41 from being fragile due to collision or pressure.

As shown in FIG. 8, according to one embodiment of the present invention, a diameter of a maximum inscribed circle of the vent 41 is less than 2 mm, and in some embodiments, preferably, 1.0~1.9 mm. As a result, both bugs and most dust can be prevented from entering thereto, and the efficiency of the vent 41 can be improved/maintained. In one embodiment, the vent 41 defines both a length direction and a width direction, i.e. the vent has a length and a width, and the length is greater than the width. The largest width of inscribed circle of the vent 41 may be less than 2 mm. In an embodiment, the largest width is from 1 mm to 1.9 mm. In another embodiment, the largest width of the vent 41 may be greater than 1 mm. If the width of the vent 41 is less than 1 mm, then more pressure is required to push air to enter the vent 41, which would cause to block air flow.

Figure 9A:
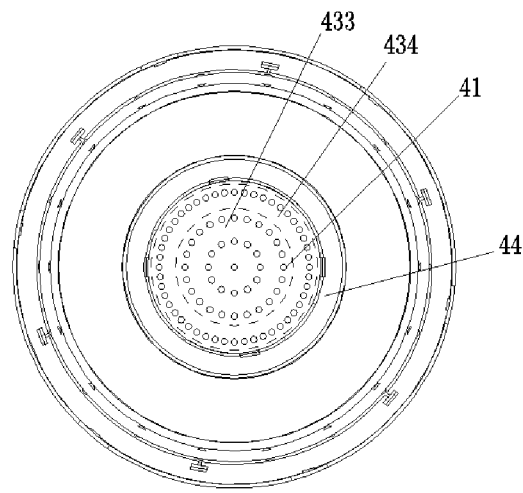
FIGS. 9A~9G are schematic views of some embodiments of the lamp cover.
Figure 9B:
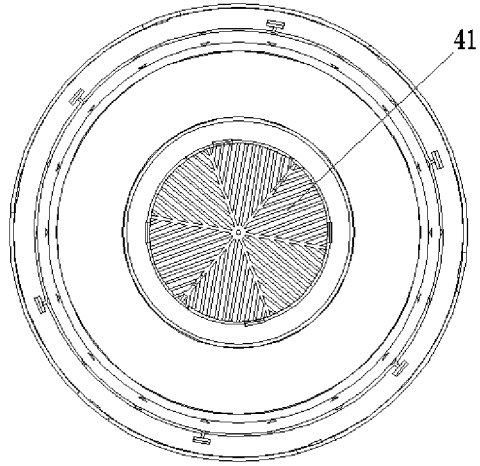
Figure 9C:
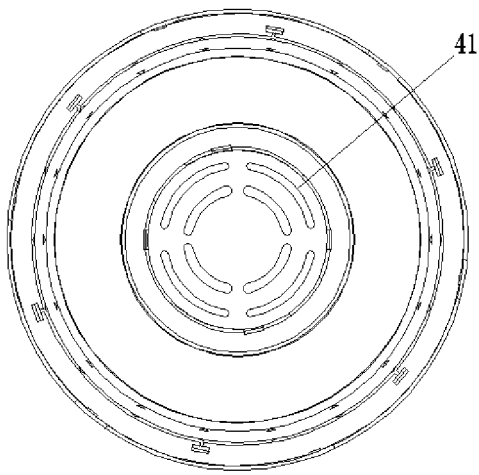
Figure 9D:
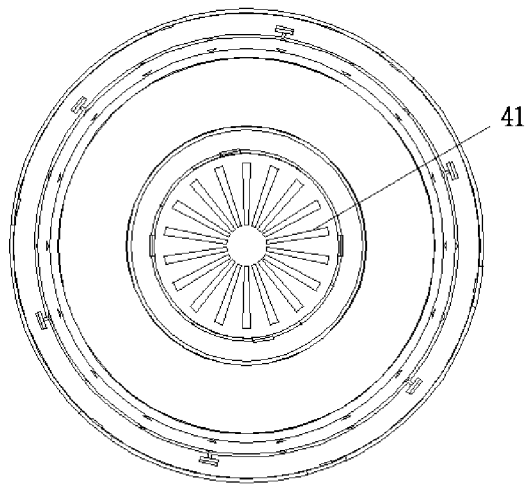
Figure 9E:
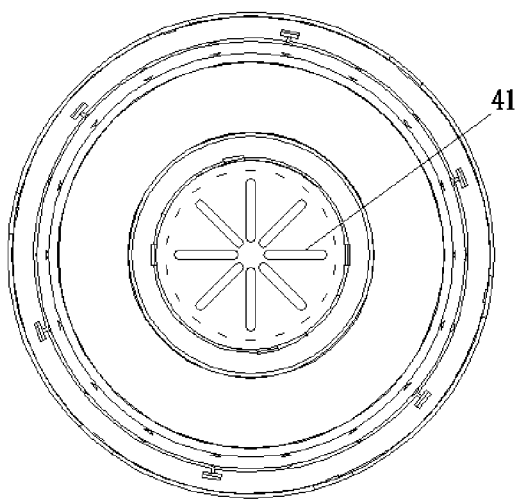
Figure 9F:
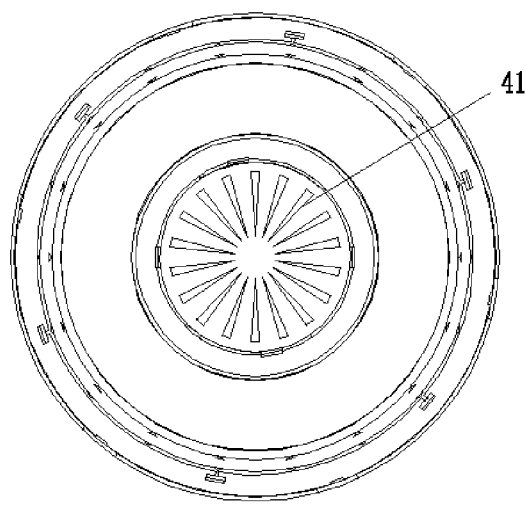
Figure 9G:
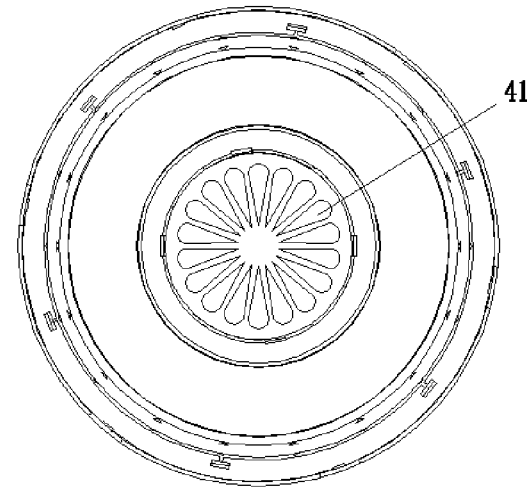

FIGS. 9A~9G show shapes of some embodiments of the vent 41. As shown in FIGS. 9A-9G, the vent 41 may be circular, strip-shaped, arced, trapezoidal, diamond or their combination. According to one embodiment as shown in FIG. 9A, when the vent 41 is configured to be circular in shape, and the diameter is less than 2 mm to resist bugs and most dust and provide sufficient venting efficiency of the vent 41. According to the embodiments as shown in FIGS. 9B and 9C, the vent 41 is configured to be strip-shaped or arced, its width should be less than 2 mm to accomplish the above effects. According to another embodiment as shown in FIG. 9D, when the vent 41 is configured to be trapezoidal, its lower base should be less than 2 mm to accomplish the above effects. In another embodiment as shown in FIG. 9E, when the vent 41 is configured to be round-cornered rectangular, its width should be less than 2 mm to accomplish the above effects. In other embodiments as shown in FIGS. 9F and 9G, when the vent 41 is configured to be triangular or drop-shaped, a diameter of its maximum inscribed circle should be less than 2 mm.

In some embodiments, the number of vent 41 on the end surface 44 is plural. For example, the vents 41 may be annularly arranged on the end surface 44 for even air intake. In some embodiments, the vents 41 are radially arranged on the end surface 44. In other embodiments, the vents 41 are irregularly arranged.

In some applications, there may be a limit for the overall weight of an LED lamp. For example, when an LED lamp adopts an E39 head, its maximum weight limit is 1.7 Kg. Thus, besides the fundamental elements such as a power source, a lamp cover and a lamp shell, in some embodiments, weight of a heat sink is limited within 1.2 Kg. For some high-power LED lamps, the power is about 150 W~300 W, and their luminous flux can reach 20000 lumens to 45000 lumens. Under a limit of weight, a heat sink should dissipate heat from an LED lamp with 20000~45000 lumens. Under a condition of heat dissipation of natural convection, usually power of 1 W needs an area of heat dissipation of at least 35 square cm. The following embodiments are designed to reduce area of heat dissipation for power of 1 W while ensuring the installation space and heat dissipating effect of the power source 5, thereby, achieving the best under the premise of the weight limit of the heat sink 1 and the limitation of the power source 5 heat radiation.

As shown in FIGS. 1 and 2, in this embodiment, the LED lamp includes passive heat dissipating elements which adopt natural convection and radiation as a heat dissipating manner without any active heat dissipating elements such as a fan. The passive heat dissipating element in this embodiment includes a heat sink 1 composed of fins 11 and a base 13. The fins 11 radially extend from and connect to the base 13. When using the LED lamp, at least part of heat from the LED chips 311 is conducted to the heat sink 1 by thermal conduction. At least part of heat occurring from the heat sink 1 is transferred to external air by thermal convection and radiation. A diameter of a radial outline of the heat sink 1, in a hanging status as shown in the figures, tapers off upward or is substantially in a taper shape for a better match with a lampshade.

In this embodiment, when a passive heat dissipation manner (fanless) is adopted, the ratio of power (W) of the LED lamp to heat dissipating surface area (square cm) of the heat sink 1 is 1:20~30. That is, each watt needs heat dissipating surface area of 20~30 square cm for heat dissipation. Preferably, the ratio of power of the LED lamp to heat dissipating surface area of the heat sink 1 is 1:22~26. More preferably, the ratio of power of the LED lamp to heat dissipating surface area of the heat sink 1 is 1:25. The first heat dissipating channel 7a is formed in the lamp shell 2, the first heat dissipating channel 7a has the first air inlet 2201 at an end of the lamp shell 2, and another end of the lamp shell 2 has the venting hole 222. Air flows into the first air inlet 2201 and flows out from the venting hole 222 to bring out heat in the first heat dissipating channel 7a. The second heat dissipating channel 7b is formed in the fins 11 and the base 13 and the second heat dissipating channel 7b has the second air inlet 1301. Air flows into the second air inlet 1301, passes the second heat dissipating channel 7b, and finally flows out from the spaces between the fins 11 to bring out heat radiated from the fins 11 to air therearound and enhance heat dissipation of the fins 11. By both the first and second heat dissipating channels 7a, 7b, efficiency of natural convection can be increased. This reduces required area of heat dissipation of the heat sink 1 so as to make the ratio of power of the LED lamp to heat dissipating area of the heat sink 1 be between 20 and 30. In this embodiment, overall weight of the LED lamp is less than 1.7 Kg. When the LED lamp is provided with power of about 200 W (below 300 W, preferably, below 250 W), the LED chips 311 are lit up and emit luminous flux of at least 25000 lumens.

As shown in FIG. 1, weight of the heat sink 1 in this embodiment accounts for above 50% of weight of the LED lamp. In some embodiments, weight of the heat sink 1 accounts for 5565% of weight of the LED lamp. Under this condition, volume of the heat sink 1 accounts for above 20% of volume of the overall LED lamp. Under a condition of the same thermal conductivity of the heat sink 1 (i.e. overall heat sink 1 uses a single material or two different materials with almost identical thermal conductivity), the larger the volume occupied by the heat sink 1 is, the larger the heat dissipating area which can be provided by the heat sink 1 is. As a result, when volume of the heat sink 1 accounts for above 20% of volume of the overall LED lamp, the heat sink 1 may have more usable space to increase its heat dissipating area. Considering the arrangement space of the power source 5, the lamp cover 4 and the lamp shell 2, preferably, volume of the heat sink 1 accounts for 20%~60% of volume of the overall LED lamp. More preferably, volume of the heat sink 1 accounts for above 2550% of volume of the overall LED lamp. Therefore, when the overall size of the LED lamp is limited, and the installation space of the power source 5, the lamp cover 4 and the lamp housing 2 needs to be ensured, the volume of the heat sink 1 is maximized, which is more conducive to the design of the overall heat dissipation of the LED lamp.

Figure 11:
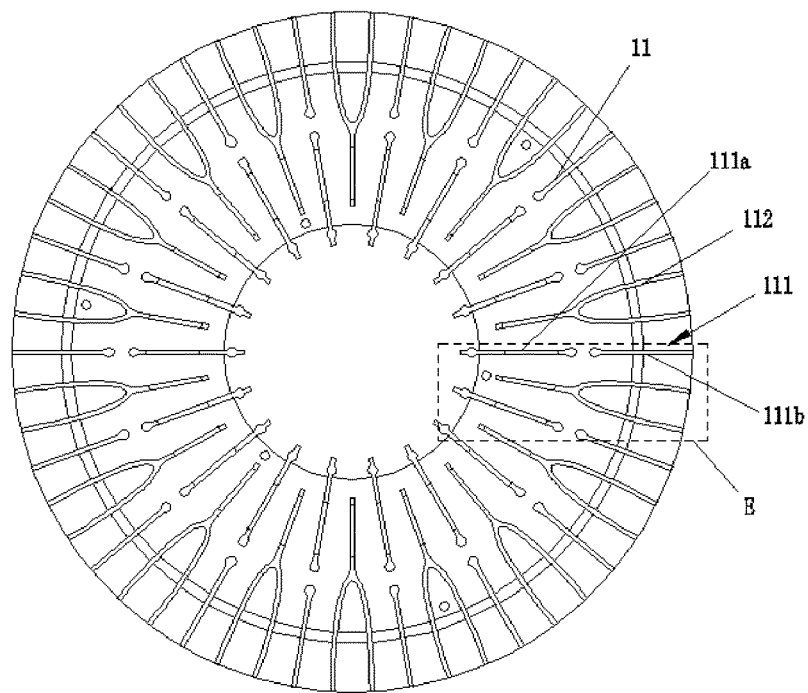
FIG. 11 is a top view of the heat sink of the LED lamp of FIG. 10.

FIG. 11 is top view of the heat sink 1 of the LED lamp according to an embodiment. As shown, the heat sink 1 suffers the above volume limit, so at least part of the fins 11 are extended outward in a radial direction of the LED lamp with at least two sheets at an interval. By such an arrangement, the fins 11 in a fixed space can have larger area of heat dissipation. In addition, the extended sheets form support to the fins 11 to make the fins firmly supported on the base 13 to prevent the fins 11 from deflecting.

In detail, as shown in FIG. 11, the fins include first fins 111 and second fins 112. The bottoms of both the first fins 111 and the second fins 112 in an axis of the LED lamp connect to the base 13. The first fins 111 interlace with the second fins 112 at regular intervals. Being projected from the axial direction of the LED lamp, each of the second fins 112 is to be seen as a Y-shape. Such Y-shaped second fins 112 can have more heat dissipating area under a condition of the heat sink 1 occupying the same volume. In this embodiment, both the first fins 111 and the second fins are evenly distributed on a circumference, respectively. Every adjacent two of the second fins 112 are symmetrical about one of the first fins 111. In this embodiment, an interval between one of the first fins 111 and adjacent one of the second fins 112 is 8~12 mm. In general, to make air flow in the heat sink 1 smooth and to make the heat sink perform a maximum effect of heat dissipation, intervals between the fins 11 should be as uniform as possible.

As shown in FIGS. 6 and 11, at least one of the fins 11 is divided into two portions in a radial direction of the LED lamp. Thus, a gap between the two portions forms a passage to allow air to pass. In addition, the projecting area of the gap directly exactly corresponds to an area that the LED chips 311 are positioned on the LED board 3 to enhance convection and improve an effect of heat dissipation to the LED chips 311. In an aspect of limited overall weight of the LED lamp, part of the fins 11 divided with a gap reduces the amount of the fins 11, decreases overall weight of the heat sink 1, and provides a surplus space to accommodate other elements.

Figure 12:
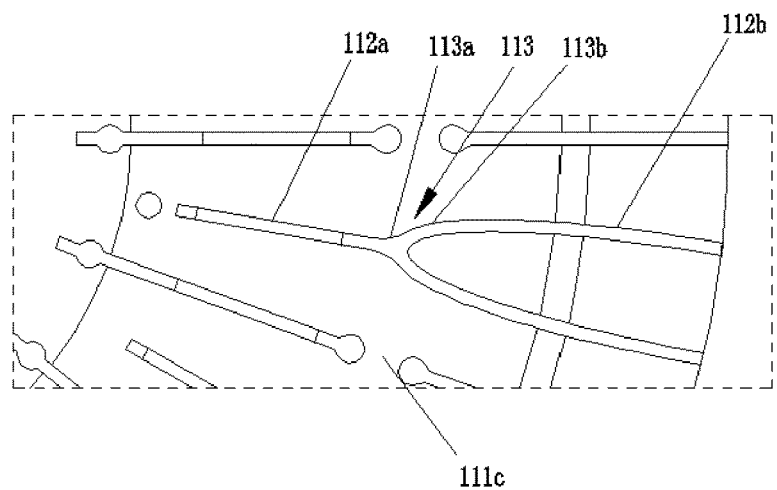
FIG. 12 is an enlarged view of portion E in FIG. 11.
Figure 13:
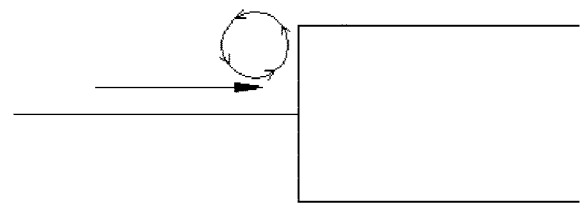
FIG. 13 is a schematic view showing a vortex formed by air near the second fins according to another embodiment of the present invention.

FIG. 12 is an enlarged view of portion E in FIG. 11. As shown in FIGS. 11 and 12, the fins 11 include first fins 111 and second fins 112. Each of the first fins 11 is divided into two portions in a radial direction of the LED lamp, i.e. a first portion 111a and a second portion 111b. The two portions are divided with a gap portion 111c. The first portion 111a is located inside the second portion 111b in a radial direction. Each of the second fins 112 has a third portion 112a and a fourth portion 112b extending therefrom. The fourth portions 112b are located radially outside the third portions 112a to increase space utilization and make the fins have more heat dissipating are for heat dissipation. As shown in FIG. 12, the third portion 112a is connected to the fourth portion 112b through a transition portion 113. The transition portion 113 has a buffer section 113a and a guide section 113b. At least one or both of the buffer section 113a and the guide section 113b are arced in shape. In other embodiment, both the buffer section 113a and the guide section 113b are formed into an S-shape or an inverted S-shape. The buffer section 113a is configured to prevent air radially outward flowing along the second fins 112 from being obstructed to cause vortexes. Instead, the guide section 113b is configured to be able to guide convection air to radially outward flow along the second fins 112 without interference (as shown id FIG. 13).

As shown in FIG. 12, one of the second fins 112 include a third portion 112a and two fourth portions 112b. The two fourth portions 112b are symmetrical about the third portion 112a. In other embodiments, one of the second fins 112 may include a third portion 112a and multiple fourth portions 112b such as three or four fourth portions 112b (not shown). The multiple fourth portions 112b of the second fin 112 are located between two first fins 111.

As shown in FIG. 12, a direction of any tangent of the guide section 113b is separate from the gap portion 111c to prevent convection air from flowing into the gap portion 111c through the guide portion 113b, such that the poor efficiency of heat dissipation caused by longer convection paths is able to be avoid as well. Preferably, a direction of any tangent of the guide section 113b is located radially outside the gap portion 111c. In other embodiments, a direction of any tangent of the guide section 113b is located radially inside the gap portion 111c.

Figure 14:
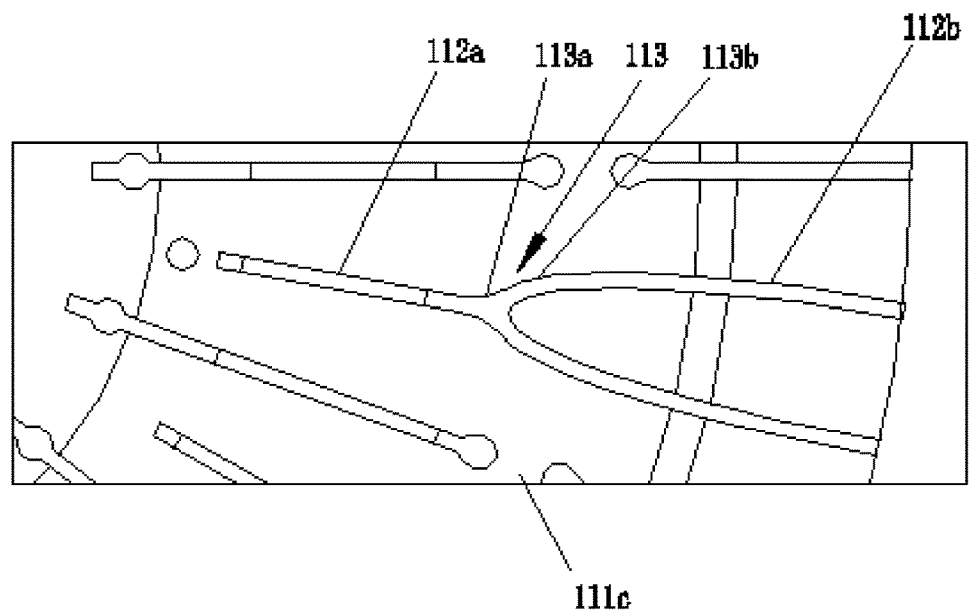
FIG. 14 is a partially schematic view of the heat sink of another embodiment.

As shown in FIG. 14, in another embodiment, a direction of any tangent of the guide section 113b falls in the gap portion 111c to make convection more sufficient but convection paths will increase.

Figure 10:
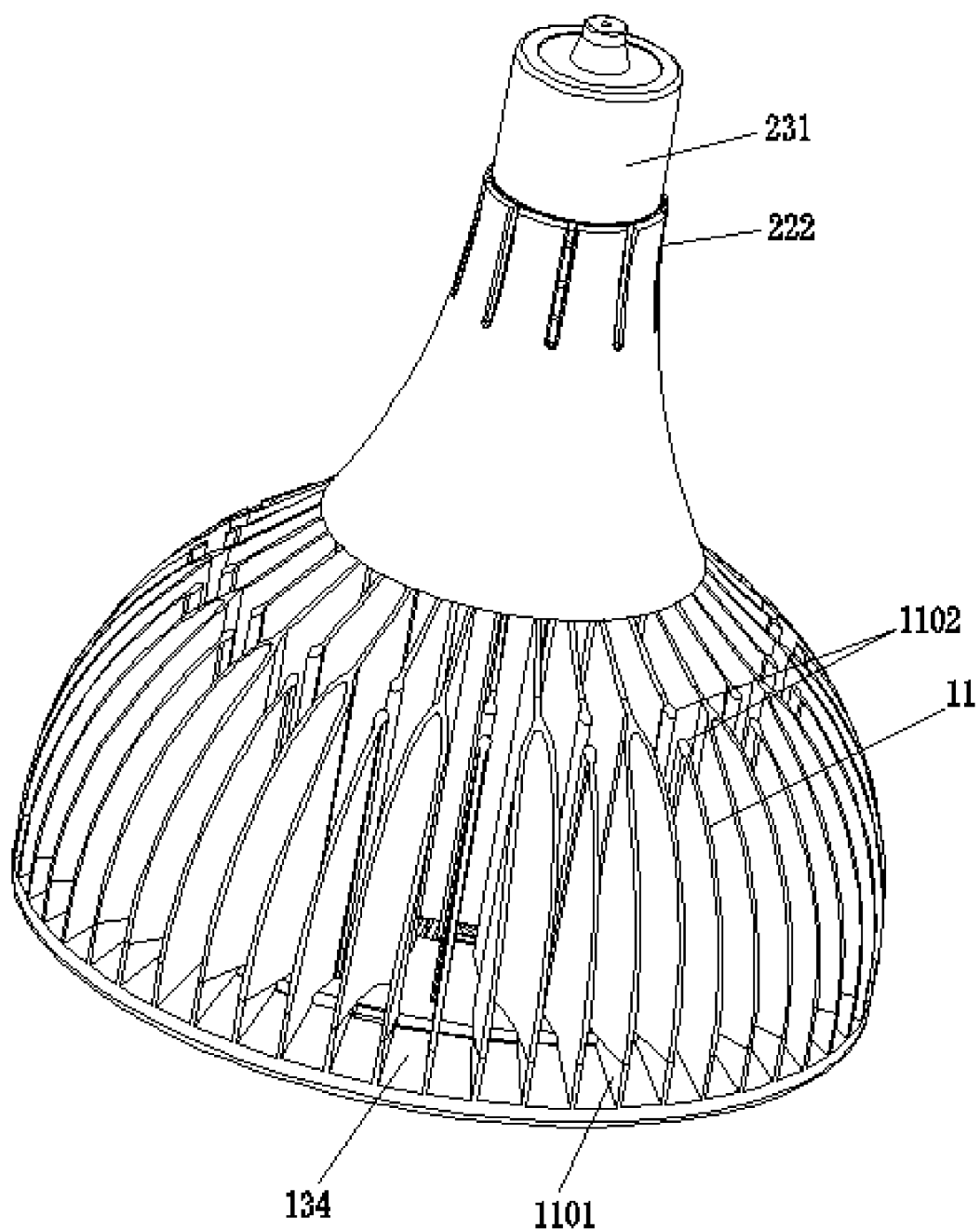
FIG. 10 is a perspective view of an LED lamp, according to another embodiment of the present invention.

As shown in FIG. 10, at least partially of fin 11 has a protrusion 1102 projecting from a surface of the fin 11. The protrusions 1102 extend along an axis of the LED lamp and are in contact with the base 13. A surface of the protrusion 1102 may selectively adopt a cylindrical shape or a regular or an irregular polygonal cylinder. The protrusions 1102 increase surface area of the fins 11 to enhance efficiency of heat dissipation. In addition, the protrusions 1102 also form a support effect to the fins 11 to prevent the fins 11 from being inflected in manufacture. In some embodiments, a single fin 11 is divided into two portions in a radial direction of the LED lamp. Each portion is provided with at least one protrusion 1102 to support the two portions. In this embodiment, the protrusion 1102 is located at an end portion of each fin 11 in a radial direction of the LED lamp, for example, at end portions of the first portions 111a, 111b (the ends near the gap portion 111c).

LEDs generate heat while they are emitting. A key parameter in considering of thermal conduction of LEDs is thermal resistance. The smaller the thermal resistance is, the better the thermal conduction is. Primarily, factors of thermal resistance include length of conduction path, conduction area and thermal conductivity of a thermo-conductive material. It can be expressed by the following formula:

Thermal resistance=length of conduction path
$L$/(conduction area $S$*thermal conductivity)

That is to say, the shorter the conduction path is and the larger the conduction area is, the lower the thermal conductivity is.

Figure 15:
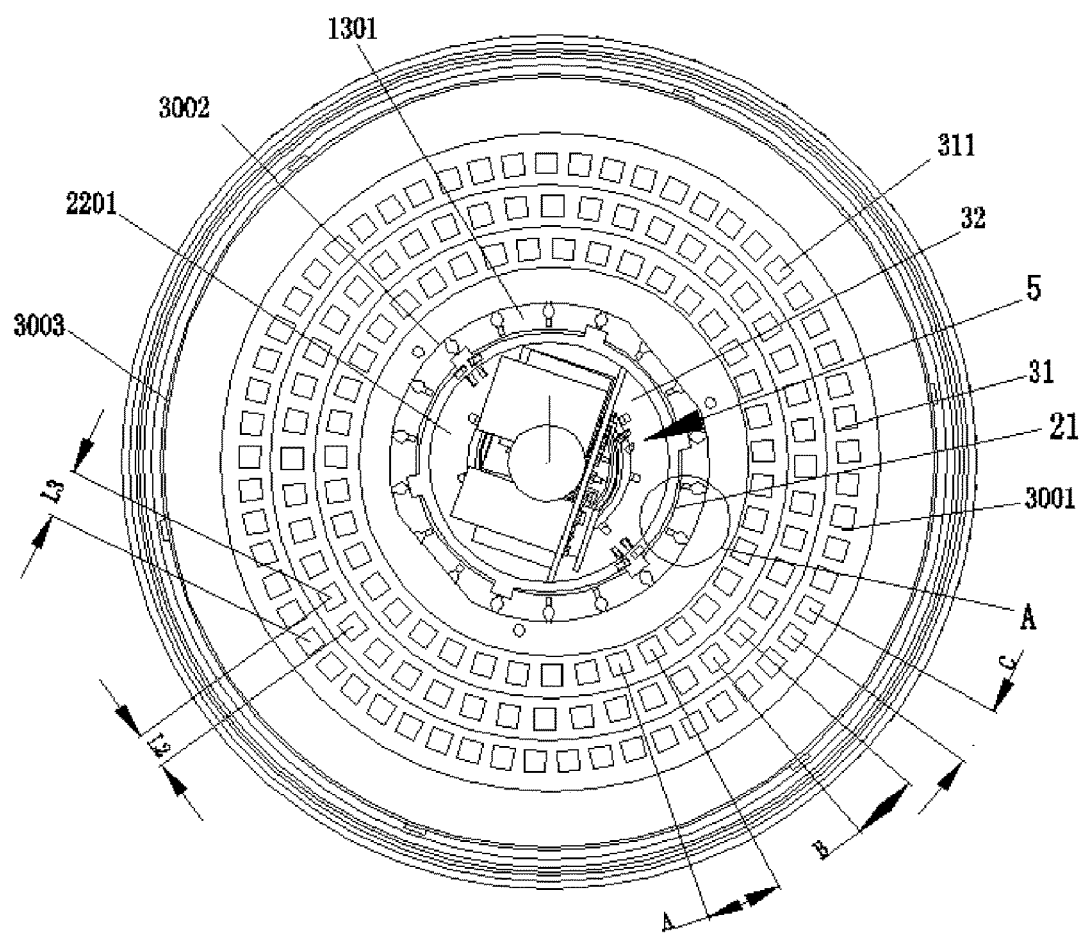
FIG. 15 is a bottom view of the LED lamp of FIG. 1 without the lamp cover.

As shown in FIG. 15, in this embodiment, the light board 3 includes at least one LED chip set 31 having LED chips 311.

As shown in FIG. 15, in this embodiment, the light board 3 is divided into three areas comprising an inner ring, a middle ring and an outer ring. All the LED chip sets 31 are located in the three areas. In one example, the inner ring, the middle ring and the outer ring are separately mounted by different amount of LED chip sets 31. In another aspect, the light board 3 includes three LED chip set 31. The three LED chip sets 31 are respectively located in the inner ring, the middle ring and the outer ring. Each of the LED chip sets 31 separately in the inner ring, the middle ring and the outer ring has at least one LED chip 311.

Four hypothetical circle lines are defined on the light board 3 as shown in FIG. 15. The outer ring is defined by the area between the outermost two circle lines of the four, the inner ring is defined by the area between the innermost two circle lines of the four, and the middle ring is located between the two areas mentioned above. In another embodiment, the light board 3 is separated into two rings (areas), and the chip sets 31 are divided to be mounted on the two rings.

As shown in FIG. 15, several LED chips 311 in a circle or approximately in a circle compose an LED chip set. There are several LED chip sets 31 on the light board 3. In a single LED chip set 31, a center distance between two adjacent LED chips 311 is L2. A center distance between any LED chip 311 of any LED chip set 31 and the nearest LED chip 311 of an adjacent LED chip set 31 is L3. The ratio of L2 to L3 is 1:0.8~2, preferably, L2:L3 is 1:1~1.5. This makes distribution of the LED chips 311 so even to accomplish an object of even light output.

Figures 17, 18:
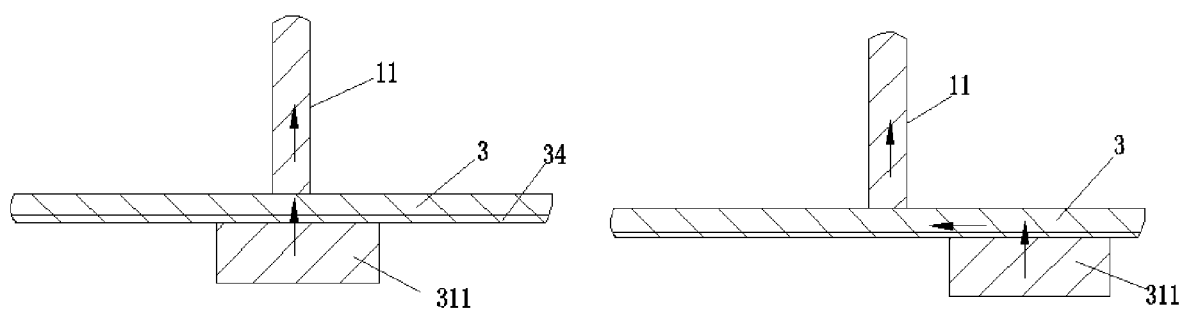
FIG. 17 is a schematic view of the combination of the fins and the LED chips, according to an embodiment.
FIG. 18 is a schematic view of the combination of the fins and the LED chips, according to some embodiments of the present invention.

FIG. 17 is a schematic view of the combination of the fins 11 and the LED chips 311 of one embodiment. As shown in FIGS. 15 and 17, in this embodiment, when at least one fin 11 is projected onto the plane on which the LED chip sets 31 are located along the axial direction of the LED lamp, a projection of the fin 11 at least touches at least one LED chip 311 of the LED chip set 31. In detail, when at least one fin 11 is projected onto a plane on which the LED chip set 31 is located along the axial direction of the LED lamp, a projection of the fin 11 at least touches at least one LED chip 311 of the LED chip set 31 in the inner ring, the middle ring or the outer ring. As shown in FIG. 17, the projection of the fin 11 touches an LED chip 311. As indicated by the arrow in the figure, it is a heat dissipating path of the LED chip 311 and the fin 11. As shown in FIG. 18, the projection of the fin 41 does not touch the LED chip 311 in the figure. As indicated by the arrow in the figure, it is a heat dissipating path of the LED chip 311 and the fin 11. It can be seen that the heat dissipating path of the latter is longer than the former's. As a result, by means of a projection of a fin at least touching at least one LED chip 311 of the LED chip set 31 in the inner ring, the middle ring or the outer ring, a heat dissipating path of the LED chip 311 can be shortened. This can reduce thermal resistance to be advantageous to thermal conduction. Preferably, a fin 11 is projected onto a plane on which the LED chip set 31 is located along the axial direction of the LED lamp, a projection of any fin 11 (the first fin 111 or the second fin 112) at least touches at least one LED chip 311 of the LED chip set 31.

In this embodiment, the LED chip sets 31 in outer rings corresponding to the fins 11 are greater than the LED chip sets 31 in inner rings in number. Here the term "corresponding to" means projection relationship in the axial direction of the LED lamp, for example, when the LED chip sets 31 in outer rings are projected onto the fins 11 in the axial direction of the LED lamp, the fins 11 to which the LED chips 31 in outer rings correspond are located on a relatively outer portion of the heat sink 1. Here the LED chip sets 31 in outer rings have more LED chips 311 in number, so they need more fins 11 (area) to implement heat dissipation.

As shown in FIGS. 1 and 15, the light board 3 has an inner border 3002 and an outer border 3003. Both the inner border 3002 and the outer border 3003 separately upward extend along the axial direction of the LED lamp to form a region. An area of part of the fins 11 inside the region is greater than an area of part of the fins 11 outside the region. As a result, the most of the fins 11 can correspond to the light board 3 (a shorter heat dissipating path) to enhance heat dissipating efficiency of the fins 11 and increase effective area of heat conduction of the fins 11 to the LED chips 311.

As shown in FIGS. 3, 5 and 15, a reflecting region 3001 is disposed in a region between the inner ring and an outer edge of the light board 3 to reflect the upward light to the light output surface 43. This can reduce loss of light in an opposite direction of light output in the axial direction of the LED lamp to increase overall intensity of light output.

As shown in FIG. 17, in one embodiment of the present invention, the light board 3 is provided with an insulative layer 34 with high reflectivity. The insulative layer 34 may adopt thermal grease. The insulative layer 34 is smeared on the light board 3 to an edge thereof. A distance between the LED chips 311 at the outermost position and an edge of the light board 3 is greater than 4 mm. Preferably, a distance between the LED chips 311 at the outermost position and an edge of the light board 3 is greater than 6.5 mm but less than 35 mm. In addition, a creepage distance between the outermost LED chips 311 and the heat sink 1 can be guaranteed to prevent arc occurring between the LED chips 311 and the heat sink. In addition, the insulative layer 34 may also have an effect of thermal isolation to prevent overheating and deformation of the lamp cover 4.

Figure 19A:
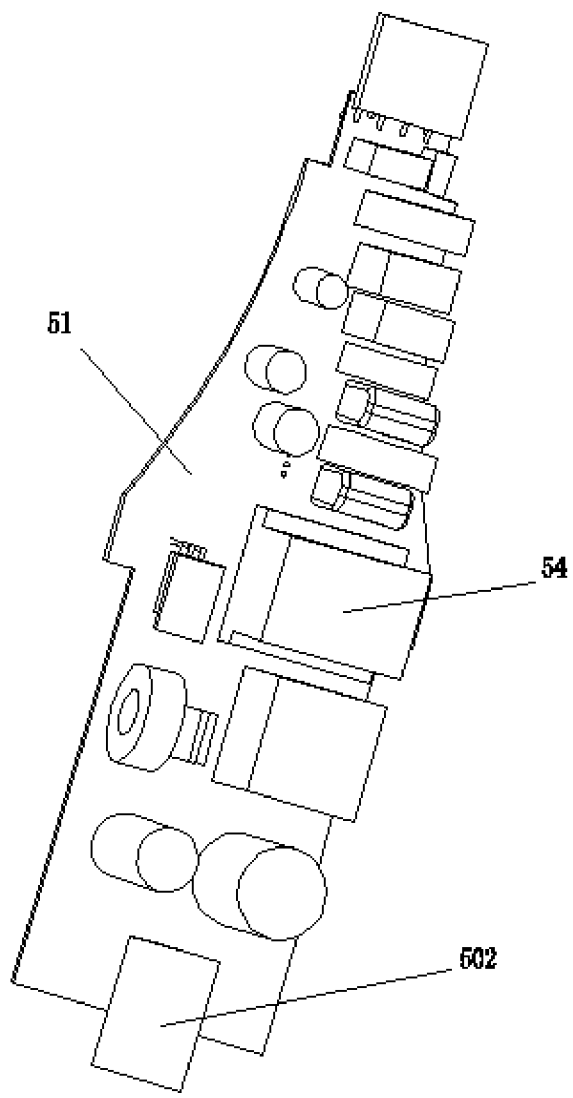
Figure 19B:
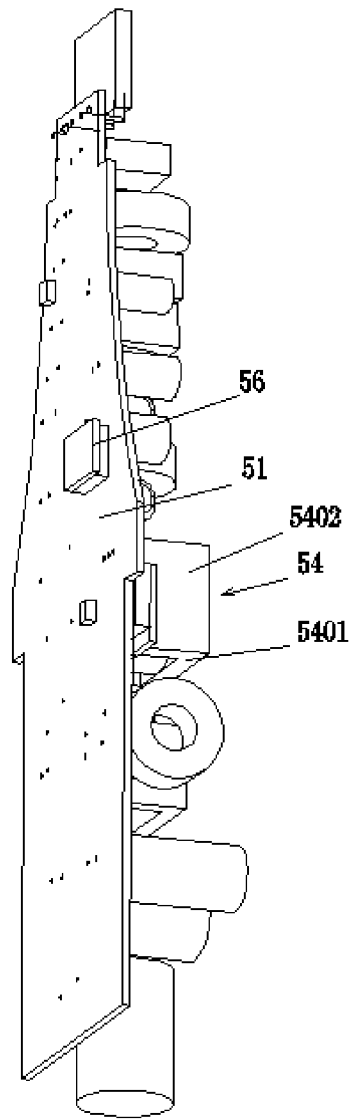

FIGS. 19A~19C are perspective views of the power source 5 of one embodiment at different viewpoints. FIG. 19D is a main view of the power source 5 of one embodiment. The power source 5 is electrically connected to the LED chips 311 to power the LED chips 311. As shown in FIGS. 19A~19C, the power source 5 includes a power board 51 and a plurality of electronic components mounted thereon.

As shown in FIGS. 1, 2, 3 and 4, the lamp shell 2 includes the lamp head 23, the lamp neck 22 and the sleeve 21. The lamp head 23 connects to the lamp neck 22 which connects to the sleeve 21. The sleeve 21 is located in the heat sink 1 (in the axial direction of the LED lamp, all or most of the sleeve 21, for example, at least 80% of height of the sleeve 21, does not exceed the heat sink 1). The lamp neck 22 projects from the heat sink 1. Both the sleeve 21 and the lamp neck 22 can provide sufficient space to receive the power source 5 and perform heat dissipation, especially for the power source 5 of a high power LED lamp (in comparison with a low power LED lamp, a power source of a high power LED lamp has more complicated composition and larger size). The power source 5 is received in both the lamp neck 22 and lamp head 23. Total height of the lamp neck 22 and the lamp head 23 is greater than height of the heat sink 1 so as to provide more space for receiving the power source 5. The heat sink 1 is separate from both the lamp neck 22 and the lamp head 23 (not overlap in the axial direction, the sleeve 21 is received in the heat sink 1). Thus, the power source 5 in both the lamp neck 22 and the lamp head 23 is affected by the heat sink 1 slightly (heat of the heat sink 1 would not be conducted to the lamp neck 22 and the lamp head 23 along a radial direction). In addition, the configuration of height of the lamp neck 22 is advantageous to the chimney effect of the first heat dissipating channel 7a to guarantee convection efficiency of the first heat dissipating channel 7a. In other embodiments, height of the lamp neck 22 is at least 80% of height of the heat sink 1 to accomplish the above function. The sleeve 21 is made of a thermo-isolated material to prevent mutual influence of heat from the fins and the power source.

As shown in FIG. 2, the second air inlet 1301 is located in a lower portion of the heat sink 1 and radially corresponds to an inner side or the inside of the heat sink 1, i.e. the second air inlet 1301 radially corresponds to the inner side or the inside of the fins 11. The inner side or the inside of the fins 11 corresponds to an outer wall (a radially inner side of the fins 11, which nears or abuts against the sleeve 21) of the sleeve 21 of the lamp shell 2. Thus, after convection air flows into the second air inlet 1301, it flows upward along the outer wall of the sleeve 21 to perform convection and radially dissipates heat in the inner side or the inside of the fins 11 and the outer wall of the sleeve 21 to implement an effect of thermal isolation. That is, this can prevent heat of the heat sink 1 is conducted from the outer wall of the sleeve 21 to the inside of the sleeve 21 not to affect the power source 5. From the above, the second heat dissipating channel 7b can not only enhance heat dissipation of the fins 11, but also implement an effect of thermal isolation. Make a positional comparison between the second air inlet 1301 and the LED chips 311, the second air inlet 1301 is located radially inside all of the LED chips 311.

FIG. 20 is an enlarged view of portion B in FIG. 2. As shown in FIG. 20, the lamp head 23 includes a metal portion 231 and an insulative portion 232. Wires of the power source 5 penetrate through the insulative portion 232 to connect with an external power supply. The metal portion 231 connects to the lamp neck 22. In detail, as shown in FIG. 21, an inner surface of the metal portion 231 is provided with a thread through which the lamp neck 22 can be screwed on with the metal portion 231. While the metal portion 231 is dissipating heat generated from the power source 5 in the lamp shell 2 (as described in the above embodiment, at least part of the inner wall of the metal portion 231 forms a wall of the inner chamber of the lamp shell 2, so the thermal conductor directly connects with the metal portion 231 and the metal portion 231 can be used for heat dissipation), an outer surface of the metal portion 231 is formed with a projecting structure 2311 as shown in FIG. 21 to add surface area of the outer surface of the metal portion 231 and enlarge heat dissipating area of the metal portion 231 to increase efficiency of heat dissipation. As for the power source 5, at least part of the power source 5 is located in the lamp head 23, and at least part of heat generated from the power source 5 can be dissipated through the lamp head 23. The inner wall of the metal portion 231 may also be formed with a projecting structure to add surface area of the inner chamber of the lamp shell 2. In this embodiment, the projecting structure can be implemented by forming a thread on the inner surface of the metal portion 231.

Figure 7:
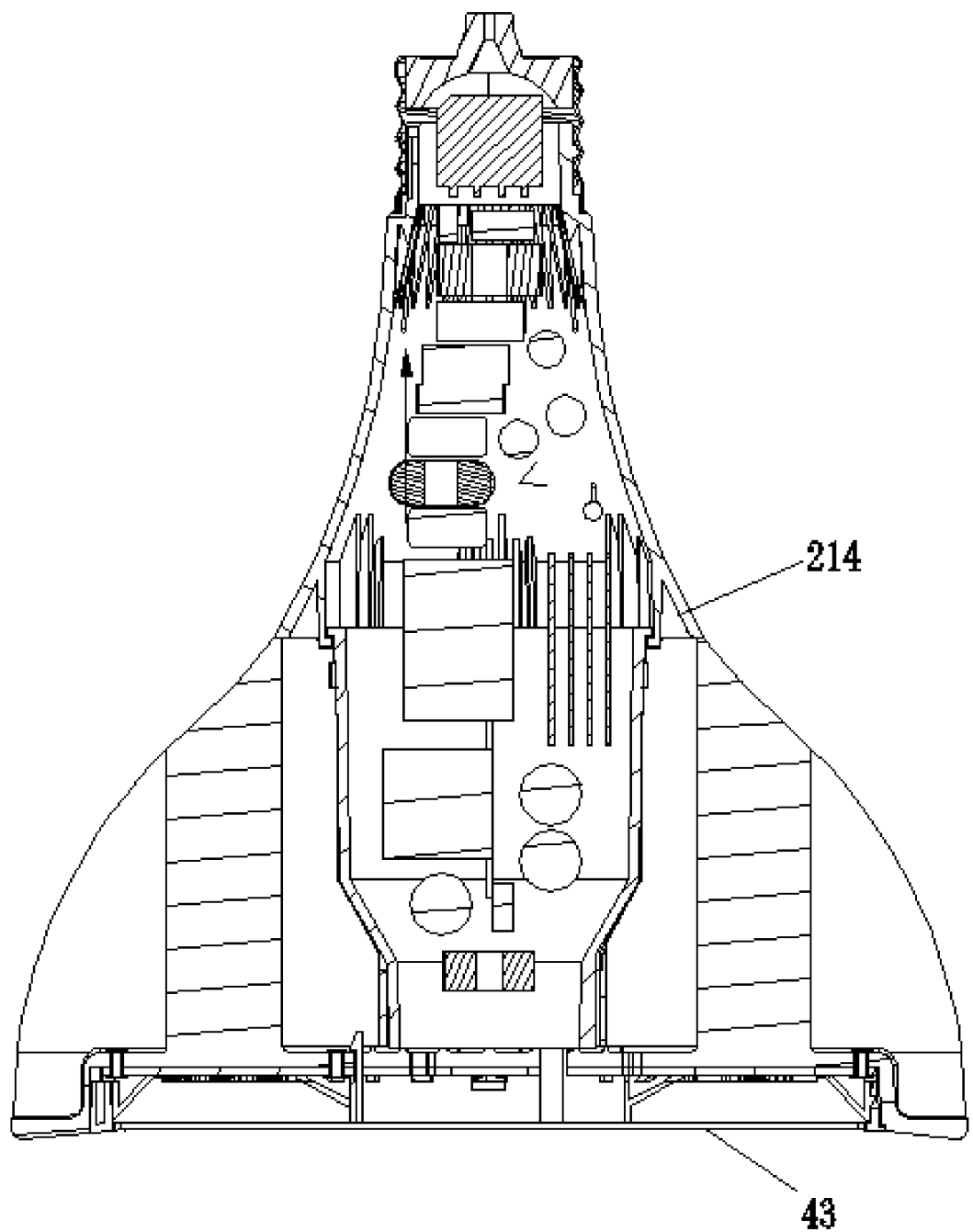
FIG. 7 is a cross-sectional view of another embodiment of the LED lamp according to aspects of the invention, which shows the flat light output surface.
Figure 16:
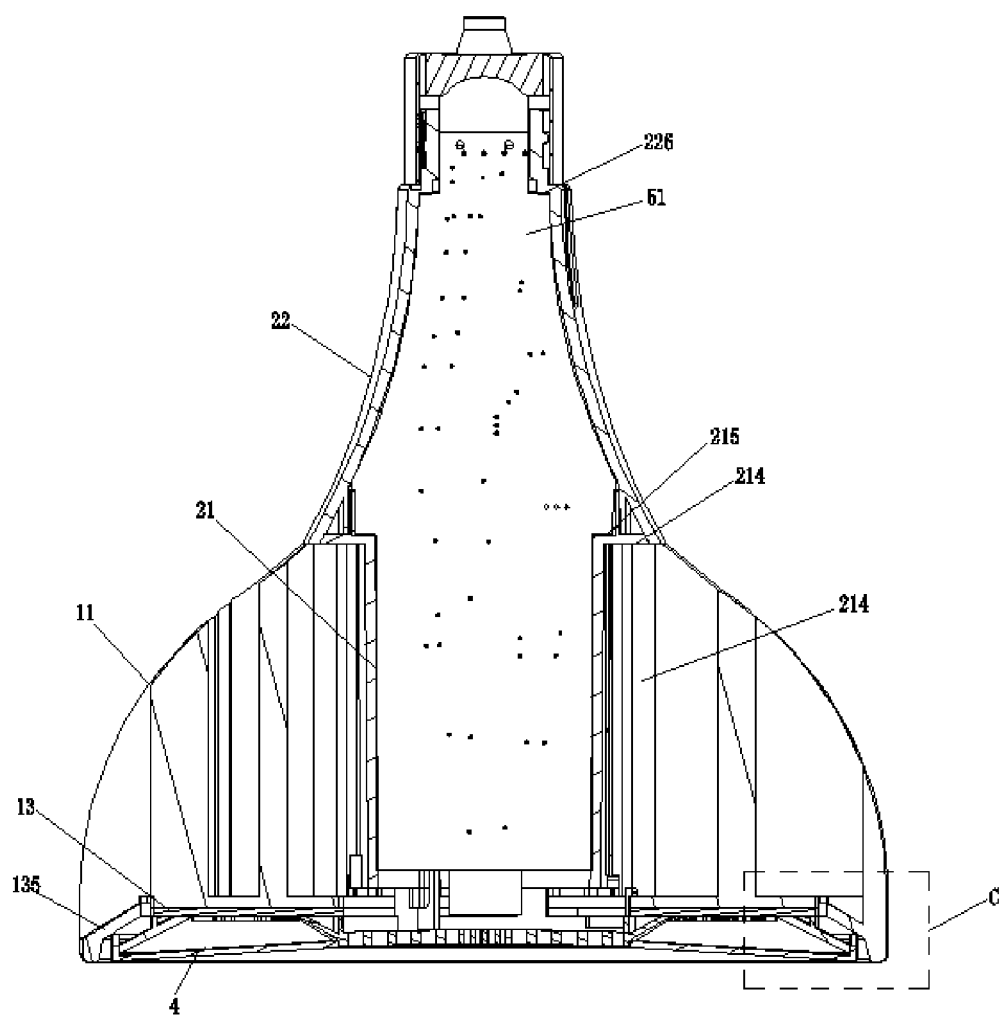
FIG. 16 is a cross-sectional view of an LED lamp, according to another embodiment of the present invention.

As shown in FIGS. 1 and 16, the lamp shell 2 has an airflow limiting surface 214 which extends radially outwardly and is located away from the venting hole 222. The airflow limiting surface 214 cloaks at least part of the fins 11. When the fins are dissipating heat, hot airflow heated by the part of fins 111 cloaked by the airflow limiting surface 214 rises but is blocked by the airflow stopping surface 214 to change its direction (outward along the airflow stopping surface 214). Thus, rising hot airflow is forced to go away from the venting hole 222. This can prevent hot air from both gathering around the venting hole 222 and affecting convection speed of the first heat dissipating channel 7a. Also, this arrangement can prevent rising hot air from both being in contact with the metal portion 231 of the lamp head 23 and affecting heat dissipation of the metal portion 231. Even hot air directly passing the metal portion 231 to conduct into the inner chamber of the lamp shell 2 can also be avoided. The airflow stopping surface 214 may be formed on the sleeve 21. As shown in FIG. 7, in another embodiment of the present invention, the airflow stopping surface 214 may also be formed on the lamp neck 22.

As shown in FIG. 16, in this embodiment, upper portions of at least part of the fins 11 in the axial direction of the LED lamp correspond to the airflow stopping surface 214. When the lamp shell 2 is inserted into the heat sink 1, the airflow stopping surface 214 will have a limiting effect on the lamp shell 2. In this embodiment, the fins abut against the airflow stopping surface 214.

As shown in FIG. 16, in this embodiment, both a wall of the sleeve 21 and a wall of the lamp neck 22 jointly constitute a wall of the inner chamber of the lamp shell 2. Height of the heat sink 1 in the axial direction does not exceed the height of the sleeve 21 to make the heat sink 1 corresponds to the sleeve 21 in a radial direction of the LED lamp. That is, the sleeve 21 has an effect of thermal isolation to prevent heat of the heat sink 1 from being conducted to the sleeve 21, so that electronic components of the power source 5 would not be affected. All the lamp neck 22 is higher than a position of the heat sink 1. That is, in a radial direction of the LED lamp, the heat sink 1 does not overlap the lamp neck 22. This can make thermal conduction between the heat sink 1 and the lamp neck 22, and prevent heat from the heat sink 1 to conduct to the inside of the lamp neck 22, so that the electronic components therein would not be affected. As a result, in this embodiment, heat conducting efficiency of the wall of the sleeve 21 is configured to be lower than heat conducting efficiency of the wall of the lamp neck 22. Advantages of such configuration are as follows: (1) because heat conducting efficiency of the sleeve 21 is relatively low, thermal conduction from the heat sink 1 to the sleeve 21 can be reduced to prevent electronic components in the sleeve 21 from being affected by the heat sink 1; and (2) because thermal conducting from the heat sink 1 to the lamp neck 22 does not need to be considered, heat conducting efficiency of the lamp neck 22 can be increased to be advantageous to dissipating heat from the electronic components of the power source 5 through the lamp neck 22. This can avoid life shortening of the power source 5 due to overheating. In this embodiment, in order to make heat conducting efficiency of the wall of the sleeve 21 be lower than heat conducting efficiency of the wall of the lamp neck 22, the sleeve 21 is made of a material with low thermal conductivity and the lamp neck 22 is made of a material with relatively high thermal conductivity. To increase thermal conductivity of the lamp neck 22, the lamp neck 22 may be provided with a venting hole 222 or a heat conducting portion (not shown) such as metal or other materials with high thermal conductivity.

As shown in FIG. 16, the lamp neck 22 has an upper portion and a lower portion. The venting hole 222 is located in the upper portion. Cross-sectional area of the upper portion is less than cross-sectional area of the lower portion.

Airflow speed in the upper portion is faster than that in the lower portion, so that initial speed of air ejected from the venting hole 222 can be increased to prevent hot air from gathering around the venting hole 222. In this embodiment, cross-sectional area of the lamp neck 22 upward tapers off in the axial direction to avoid obstruction to air flow. In this embodiment, cross-sectional area of an inlet of the lower portion of the sleeve 21 is greater than that of the upper portion of the lamp neck 22.

As shown in FIG. 1, the venting hole 222 of the lamp neck 22 is of a strip shape and extends along the axial direction of the LED lamp. Because of gravity of the LED lamp itself, the lamp neck 22 would suffer an axial pulling force. The venting hole 222 are configured to be of a strip shape extending the axial direction of the LED lamp, so stress concentration caused by the venting hole 222 in the lamp neck 22 can be prevented. A maximum diameter of an inscribed circle of the venting hole 222 is less than 2 mm, preferably, between 1 mm and 1.9 mm. As a result, the venting hole 222 can prevent bugs from entering and prevent most dust from passing. On the other hand, the vent 41 can keep better efficiency of air flow. On the other hand, if the venting hole 222 is configured to annular extending along a circumferential portion of the lamp neck 22, then the lamp neck 22 may be deformed by weight of the heat sink 1 to make the venting hole 222 become larger. This would cause that a maximum diameter of an inscribed circle of the venting hole 222 is greater than 2 mm, this cannot satisfy the requirement.

As shown in FIG. 10, the venting hole 222 is outside an outer surface of the metal portion 231 in radial directions. This can reduce influence to the metal portion 231 because of rising air ejected from the venting hole 222 and prevent heat from being conducted back to the lamp shell 2.

Figure 22:
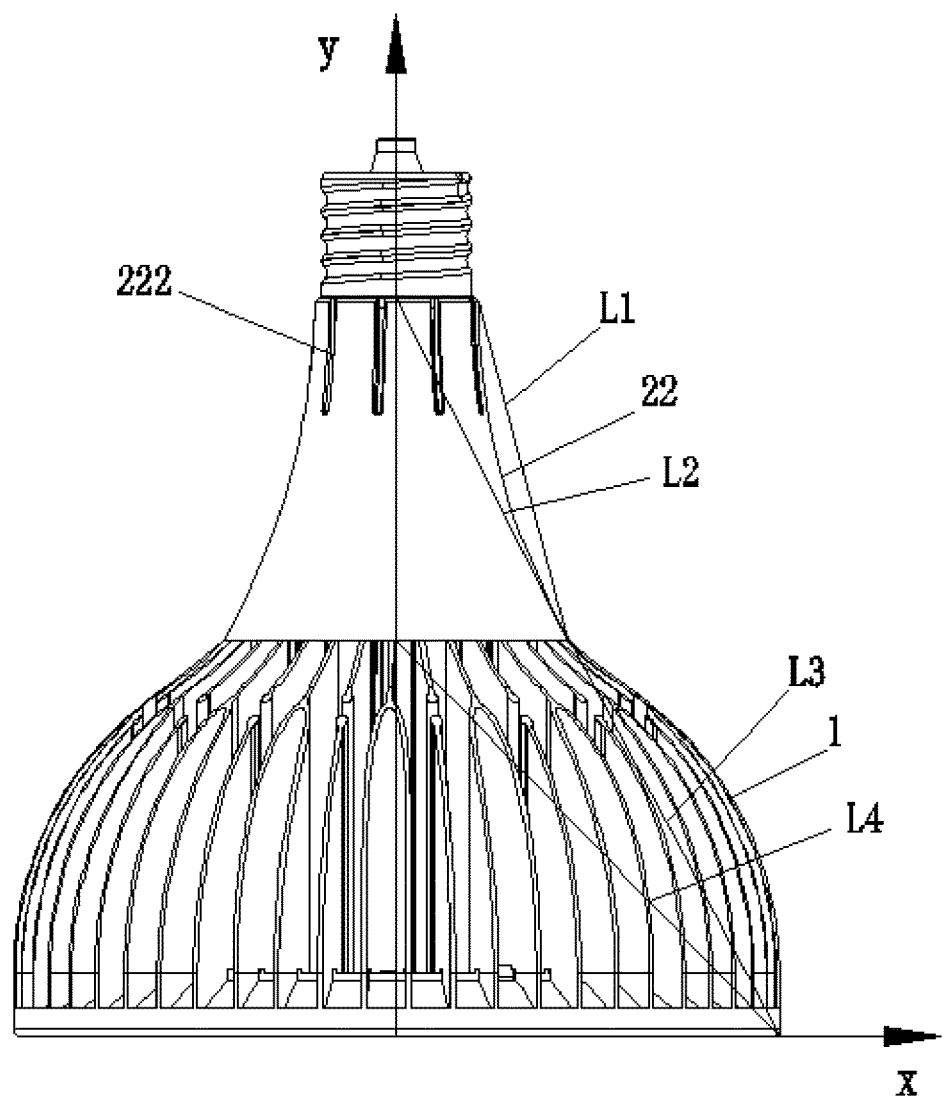
FIG. 22 is a main view of an LED lamp, according to one embodiment of the present invention.

As shown in FIG. 22, which shows an outline of the LED lamp of one embodiment. Create a Cartesian coordinate system with the axis of the LED lamp as the y-axis, a radial of the LED lamp as the x-axis and the center of the LED lamp as the origin. A lateral outline of the LED lamp detours around the axis of the LED lamp 360 degrees to turn around to form a contour of the LED lamp (not including the lamp head 23). The outline includes an outline of the LED neck 22 and an outline of the heat sink 1.

The lamp neck 22 is used for receiving the power source 5 and primarily adopts convection to implement heat dissipation to the power source 5. The outline of the lamp neck 22 has a slope a which is a constant. As shown in FIG. 22, when the outline of the lamp neck 22 is a curve, a straight line may represent an approximate slope of the outline of the lamp neck 22. For example, a line L1 between the top point and the bottom point of the outline of the lamp neck 22 can be used to represent an outline of the lamp neck 22 or a line L2 between the center of the top and the bottom point of the outline of the lamp neck 22 can be used to represent an outline of the lamp neck 22. In this embodiment, Line L1 between the top point and the bottom point of the outline of the lamp neck 22 is used to represent an outline of the lamp neck 22 for description.

The heat sink 1 primarily adopts conduction to implement heat dissipation to the LED chips 311. The outline of the heat sink 1 has a slope b which is a constant. As shown in FIG. 22, when the outline of the heat sink 1 is a curve, a straight line may represent an approximate slope of the outline of the heat sink 1. For example, a line L3 between the top point and the bottom point of the outline of the heat sink 1 can be used to represent an outline of the heat sink 1 or a line L4 between the center of the top and the bottom point of the outline of the heat sink 1 can be used to represent an outline of the heat sink 1. In this embodiment, Line L3 between the top point and the bottom point of the outline of the heat sink 1 is used to represent an outline of the heat sink 1 for description.

In this embodiment, slope a is greater than slope b or an absolute value of slope a is greater than an absolute value of slope b. Thus, in general, the outline of the lamp neck 22 is steeper than that of the heat sink 1. For the lamp neck 22, under a condition of the same space required for installing the power source 5, in order to guarantee the chimney effect of convection in the lamp neck 22, a certain height of the lamp neck 22 must be kept. If a slope of the outline of the lamp neck 22 is gentle (small slope), to keep the same height, internal volume of the lamp neck 22 would increase, however, installation of the power source 5 may need more space. For the heat sink 1, an overall height of the lamp is controlled to guarantee an effect of heat dissipation. Thus, the heat sink 1 needs to be configured to be gentle (small slope) to control its overall height. In addition, when the heat sink 1 is gentle (small slope), under a condition of the same area of heat dissipation, the lower portion of the heat sink 1 would have more area for thermal conduction to the LED chips 311.

In this embodiment, slope a is greater than 2, preferably, 2.5~5, more preferably, 3~4, the most preferably, 3.2~3.8, to make the chimney effect of convection in the lamp neck 22 better.

In this embodiment, slope b is smaller than 3, preferably, 1~2.5, more preferably, 1.4~2, the most preferably, 1.5~1.9, to make the lower portion of the heat sink 1 have more area for conduction.

Figure 23:
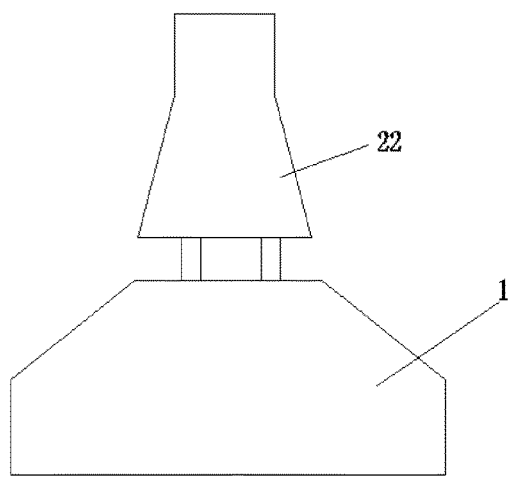
FIG. 23 is a schematic view of another embodiment of the LED lamp.

In this embodiment, the outline of the Led lamp is a continuous line, i.e. the bottom of the outline of the lamp neck 22 is connected to the top of the outline of the heat sink 1. In other embodiments, the outline may be multiple sectional lines (as shown in FIG. 23). For example, a gap is formed between the bottom of the outline of the lamp neck 22 and the top of the outline of the heat sink 1. Thus, the overall outline is discontinuous.

In this embodiment, the outline of the lamp neck 22 is a concave curve. In one example, if a straight line is connected between the top and the bottom of the outline of the lamp neck 22, then all of the outline of the lamp neck 22 is inside the straight line (i.e. the side near the axis of the LED lamp). The outline of the heat sink 1 is a convex curve. In one example, if a straight line is connected between the top and the bottom of the outline of the heat sink 1, then all of the outline of the heat sink 1 is outside the straight line (i.e. the side away from the axis of the LED lamp). The outline is a smooth or approximately smooth curve to avoiding sharp angles that may cut hands. On the other hand, this makes convection air flowing along the outside of the LED lamp smoother. In this embodiment, the outline of the LED lamp is a substantially S-shaped or an inverted S-shaped including a curve on the lamp neck 22 and a curve on the heat sink 1. Both a curve on the lamp neck 22 and a curve on the heat sink 1 jointly constitute an S-shaped or an inverted S-shaped curve. It is noted that a junction of the lamp neck 22 and the heat sink 1 may form an angle which destroys smoothness of the curve. However, in general, the overall outline is still smooth. In addition, the LED neck 22 may be separate from the heat sink 1 (for example, a certain gap is kept between the lamp neck 22 and the heat sink 1). That is, a curve on the lamp neck 22 and a curve on the heat sink 1 are discontinuous, however, in general, the overall outline is still smooth. The outline of the lamp neck 22 is a concave curve, so in the downward section, an enlarging extent of the lamp neck 22 increases in size to make the final bottom of the lamp neck 22 have a larger size to connect with the heat sink 1. In one example, an initial position of the upper portion of the heat sink 1 may have a larger size. The outline of the heat sink 1 is a convex curve, so in the upward section, a reducing extent of the heat sink 1 increases in size to make the size reduction of the lower portion of the heat sink 1 become gentler and gentler. Thus, the lower portion has larger area of the heat sink 1 for heat dissipation. In other embodiments, the outline of the lamp neck 22 may be a straight line and the outline of the heat sink 1 is a curve. In addition, the straight line may be parallel to the LED lamp. In other embodiments, both the outline of the lamp neck 22 and the outline of the heat sink 1 are straight lines or multiple sectional lines.

In this embodiment, any point on the outline of the lamp neck 22 must meet a formula as follows:

$$y=-ax+k1+h,$$

where k1 is a constant and h is height of the heat sink 1. any point on the outline of the heat sink 1 must meet a formula as follows:

$$y=-bx+k2,$$

where k2 is a constant.

In this embodiment, when overall width of the LED lamp is configured to be between 100 mm and 220 mm, k1 is 100~200 and k2 is 100~200. For example, when maximum overall width of the LED lamp is 200 mm, k1 is 140~150 and k2 is 170~200.

In this embodiment, height of the lamp neck 22 is greater than 80% of height of the heat sink 1. Because the lamp neck 22 is axially separate from the heat sink 1 without overlapping, the power source 5 in the lamp neck 22 is less affected by the heat sink 1. Thus, when height of the lamp neck 22 is greater than 80% of height of the heat sink 1, more space for installing the power source 5 can be obtained and the power source 5 is less affected by the heat sink 1. In addition, when heat from the power source 5 in the lamp shell 2 is dissipated by the convection method, configuration of height of the lamp neck 22 can ensure height of the lamp shell 2 to ensure the chimney effect during convection of heat dissipation.

The above depiction has been described with reference to the accompanying drawings, in which exemplary embodiments of the disclosure are shown. This disclosure may, however, be embodied in many different forms and should not be construed as limited to the embodiments set forth herein. Rather, these embodiments are provided so that this disclosure will be thorough and complete, and will fully convey the scope of the disclosure to those skilled in the art.

What is claimed is:

1. An LED (light emitting diode) lamp comprising:
a lamp shell including a lamp head and a lamp neck, the lamp head connects to the lamp neck;
a passive heat dissipating element having a heat sink connected to the lamp shell, wherein the heat sink comprises fins, wherein a total height of the lamp neck and the lamp head is greater than a height of the heat sink;
a power source disposed in the lamp shell; and
a light emitting surface connected to the heat sink of the passive heat dissipating element and comprising LED chips electrically connected to the power source, wherein the light emitting surface and the heat sink are connected to form a heat transferring path from the LED chips to the passive heat dissipating element;

wherein a lateral outline of the LED lamp detours around an axis of the LED lamp 360 degrees turning around to form a contour of the LED lamp, the lateral outline includes an outline of the lamp neck and an outline of the heat sink, the outline of the lamp neck has a slope A which is a constant, the outline of the heat sink has a slope B which is a constant, and an absolute value of the slope A is greater than that of the slope B;

wherein a line between the center of the top and the bottom point of the outline of the lamp neck is used to represent the outline of the lamp neck, a line between the center of the top and the bottom point of the outline of the heat sink is used to represent the outline of the heat sink.

2. The LED lamp of claim 1, wherein the absolute value of slope A is greater than 2.

3. The LED lamp of claim 2, wherein the absolute value of slope A is between 3 and 4.

4. The LED lamp of claim 1, wherein the absolute value of slope B is smaller than 3.

5. The LED lamp of claim 4, wherein the absolute value of slope B is between 1.4 and 2.

6. The LED lamp of claim 1, wherein any point on the outline of the lamp neck meets a formula as follows: y=−ax+k1+h,
where k1 is a constant and h is height of the heat sink.

7. The LED lamp of claim 1, wherein any point on the outline of the heat sink meets a formula as follows: y=−bx+k2,
where k2 is a constant.

8. The LED lamp of claim 1, wherein overall weight of the LED lamp is less than 1.7 Kg, when the LED lamp is provided with power of no more than 300 W, the LED chips are lit up and emit luminous flux of at least 25000 lumens.

9. The LED lamp of claim 1, wherein the light emitting surface includes at least one LED chip set having LED chips, at least one fin of the heat sink is projected onto a plane on which the LED chip set is located along an axial direction of the LED lamp, a projection of the at least one fin at least overlaps at least one LED chip of the LED chip set.

10. The LED lamp of claim 9, wherein any of the fins is projected onto a plane on which the LED chip set is located along the axial direction of the LED lamp, a projection of any of the fins overlaps at least one LED chip of the LED chip set.

11. The LED lamp of claim 1, wherein the lamp neck has an airflow limiting surface which extends radially outwardly and is located away from the lamp head, and the airflow limiting surface cloaks at least part of the fins.

12. The LED lamp of claim 1 further comprising a heat dissipating channel, the heat sink further comprises a base, the heat dissipating channel formed in the fins and the base of the heat sink.

13. The LED lamp of claim 1, wherein the light emitting surface has an inner border and an outer border, both the inner border and the outer border separately extend upward along the axial direction of the LED lamp to form a region, wherein an area of part of the fins inside the region is greater than an area of part of the fins outside the region.

14. The LED lamp of claim 1 further comprising a heat dissipating channel, the heat sink further comprises a base, the heat dissipating channel is formed in the fins and the base of the heat sink.

15. The LED lamp of claim 14, wherein the light emitting surface has an opening to form an air inlet for the heat dissipating channel, the opening is provided in the central area of the light emitting surface.

16. An LED (light emitting diode) lamp comprising:
a lamp shell including a lamp head and a lamp neck, the lamp head connects to the lamp neck;
a passive heat dissipating element having a heat sink connected to the lamp shell, wherein the heat sink comprises fins, wherein a total height of the lamp neck and the lamp head is greater than a height of the heat sink;
a power source disposed in the lamp shell; and
a light emitting surface connected to the heat sink of the passive heat dissipating element and comprising LED chips electrically connected to the power source, wherein the light emitting surface and the heat sink are connected to form a heat transferring path from the LED chips to the passive heat dissipating element;
wherein the light emitting surface includes at least one LED chip set having LED chips, at least one fin of the heat sink is projected onto a plane on which the LED chip set is located along an axial direction of the LED lamp, a projection of the at least one fin at least overlaps at least one LED chip of the LED chip set;
wherein the lamp neck has an airflow limiting surface which extends radially outwardly and is located away from the lamp head, and the airflow limiting surface cloaks at least part of the fins.

17. The LED lamp of claim 16, wherein any of the fins is projected onto a plane on which the LED chip set is located along the axial direction of the LED lamp, a projection of any of the fins overlaps at least one LED chip of the LED chip set.

18. The LED lamp of claim 16, wherein at least one fin of the heat sink is divided into two portions in a radial direction of the LED lamp, a gap between the two portions forms a passage to allow air to pass.

19. The LED lamp of claim 18, wherein the gap directly exactly corresponds to an area that the LED chips are positioned on the light emitting surface.

20. The LED lamp of claim 16, wherein overall weight of the LED lamp is less than 1.7 Kg, when the LED lamp is provided with power of no more than 300 W, the LED chips are lit up and emit luminous flux of at least 25000 lumens.

21. The LED lamp of claim 16, wherein the light emitting surface has an inner border and an outer border, both the inner border and the outer border separately extend upward along the axial direction of the LED lamp to form a region, wherein an area of part of the fins inside the region is greater than an area of part of the fins outside the region.

* * * * *